(12) United States Patent
Mohajer et al.

(10) Patent No.: US 12,543,295 B2
(45) Date of Patent: Feb. 3, 2026

(54) HYBRID AIR/LIQUID-COOLED NETWORK ELEMENT, COOLANT DISTRIBUTION MANIFOLD BOX FOR USE IN A HYBRID AIR/LIQUID-COOLED NETWORK ELEMENT, AND METHOD FOR CONVERTING AN AIR-COOLED NETWORK ELEMENT TO A HYBRID AIR/LIQUID-COOLED NETWORK ELEMENT

(71) Applicant: Ciena Corporation, Hanover, MD (US)

(72) Inventors: Behzad Mohajer, Vancouver (CA); Terence Graham, Manotick (CA); Peter Ajersch, Gloucester (CA); Bonnie L Mack, Carp (CA); Marko Nicolici, Ottawa (CA); Michael Bishop, Ottawa (CA); Kamran Rahmani, Ottawa (CA); Simon J. Shearman, Carleton Place (CA); Daniel Rivaud, Ottawa (CA)

(73) Assignee: Ciena Corporation, Hanover, MD (US)

( * ) Notice: Subject to any disclaimer, the term of this patent is extended or adjusted under 35 U.S.C. 154(b) by 234 days.

(21) Appl. No.: 18/378,226

(22) Filed: Oct. 10, 2023

(65) Prior Publication Data
US 2024/0049434 A1    Feb. 8, 2024

Related U.S. Application Data

(63) Continuation-in-part of application No. 17/941,140, filed on Sep. 9, 2022, now Pat. No. 11,980,009, which
(Continued)

(51) Int. Cl.
*H05K 7/20* (2006.01)

(52) U.S. Cl.
CPC ..... *H05K 7/20636* (2013.01); *H05K 7/20254* (2013.01); *H05K 7/20272* (2013.01); *H05K 7/20563* (2013.01)

(58) Field of Classification Search
CPC .......... H05K 7/20254; H05K 7/20272; H05K 7/20636; H05K 7/20563
See application file for complete search history.

(56) References Cited

U.S. PATENT DOCUMENTS

| 3,874,444 A | 4/1975 | Perce et al. |
| 4,837,663 A | 6/1989 | Zushi et al. |

(Continued)

FOREIGN PATENT DOCUMENTS

| ES | 2673907 T3 | 6/2018 |
| WO | 2010022597 A1 | 3/2010 |

*Primary Examiner* — Zachary Pape
(74) *Attorney, Agent, or Firm* — Clements Bernard Walker; Christopher L. Bernard

(57) ABSTRACT

A hybrid air/liquid-cooled network element including a backplane defining a plurality of holes, one or more printed circuit boards disposed on one side of the backplane, a plurality of fan units coupled to an opposite side of the backplane and adapted to circulate an air flow to components disposed on the printed circuit board(s) through certain of the plurality of holes defined by the backplane, and one or more coolant distribution manifold boxes coupled to the opposite side of the backplane adjacent to the plurality of fan units and adapted to circulate a coolant fluid flow to one or more cold plates disposed adjacent to components disposed on the printed circuit board(s) through other of the plurality of holes defined by the backplane, where the one or more coolant distribution manifold boxes each have height and width dimensions substantially the same as each of the plurality of fan units.

16 Claims, 29 Drawing Sheets

Related U.S. Application Data is a continuation-in-part of application No. 17/071,073, filed on Oct. 15, 2020, now abandoned.

(60) Provisional application No. 63/039,936, filed on Jun. 16, 2020, provisional application No. 62/915,187, filed on Oct. 15, 2019.

(56) References Cited

U.S. PATENT DOCUMENTS

| | | | |
|---|---|---|---|
| 5,136,464 | A | 8/1992 | Ohmori |
| 5,995,368 | A | 11/1999 | Lee et al. |
| 6,698,079 | B1 | 3/2004 | Mimlitch et al. |
| 6,972,949 | B1 | 12/2005 | Helgenberg et al. |
| 7,126,820 | B2 | 10/2006 | Wei |
| 7,184,267 | B2 | 2/2007 | Patel |
| 7,259,961 | B2 | 8/2007 | Lucero et al. |
| 7,420,806 | B1 | 9/2008 | Lima et al. |
| 7,447,020 | B2 | 11/2008 | Xia et al. |
| 7,549,435 | B2 | 6/2009 | Walter |
| 7,633,754 | B1 | 12/2009 | Mumper |
| 7,701,710 | B2 | 4/2010 | Tanaka et al. |
| 7,864,519 | B2 | 1/2011 | Lin et al. |
| 7,933,120 | B2 | 4/2011 | Tanaka et al. |
| 7,957,133 | B2 | 6/2011 | Zieman et al. |
| 8,154,867 | B2 | 4/2012 | Shearman et al. |
| 8,446,725 | B2 | 5/2013 | Lam et al. |
| 8,737,067 | B1 | 5/2014 | Kim et al. |
| 8,755,192 | B1 | 6/2014 | Schrempp et al. |
| 9,072,195 | B2 * | 6/2015 | Kameno ............ H05K 7/20154 |
| 9,351,428 | B2 | 5/2016 | Eckberg et al. |
| 9,360,144 | B2 | 6/2016 | Carns et al. |
| 9,769,959 | B2 | 9/2017 | Mayenburg et al. |
| 9,788,461 | B2 | 10/2017 | Van Gaal |
| 9,894,015 | B2 * | 2/2018 | Baba ...................... H04L 49/40 |
| 9,913,403 | B2 | 3/2018 | Krug, Jr. et al. |
| 10,098,258 | B2 | 10/2018 | Chainer et al. |
| 10,431,926 | B2 | 10/2019 | Franz et al. |
| 10,749,288 | B2 | 8/2020 | Weltsch et al. |
| 10,856,446 | B2 | 12/2020 | Boyden et al. |
| 10,952,354 | B1 | 3/2021 | Chen et al. |
| 11,051,425 | B2 | 6/2021 | Sharf et al. |
| 11,122,705 | B2 | 9/2021 | Dogruoz et al. |
| 2004/0032722 | A1 | 2/2004 | Wrycraft et al. |
| 2005/0073809 | A1 | 4/2005 | Chang |
| 2005/0078449 | A1 | 4/2005 | Makooi et al. |
| 2007/0223201 | A1 | 9/2007 | Fujiya et al. |
| 2007/0258211 | A1 | 11/2007 | Sonobe et al. |
| 2008/0186668 | A1 | 8/2008 | Naufel et al. |
| 2008/0192454 | A1 | 8/2008 | Knutsson |
| 2011/0182030 | A1 | 7/2011 | Mayer |
| 2011/0222241 | A1 | 9/2011 | Shearman et al. |
| 2013/0100610 | A1 | 4/2013 | Schneider et al. |
| 2015/0077937 | A1 | 3/2015 | Daly et al. |
| 2016/0360647 | A1 | 12/2016 | Woolard et al. |
| 2017/0013742 | A1 * | 1/2017 | Oota ................. H05K 7/20572 |
| 2021/0007243 | A1 | 1/2021 | Lin |
| 2023/0049625 | A1 * | 2/2023 | Carver ............... H05K 7/20136 |

\* cited by examiner

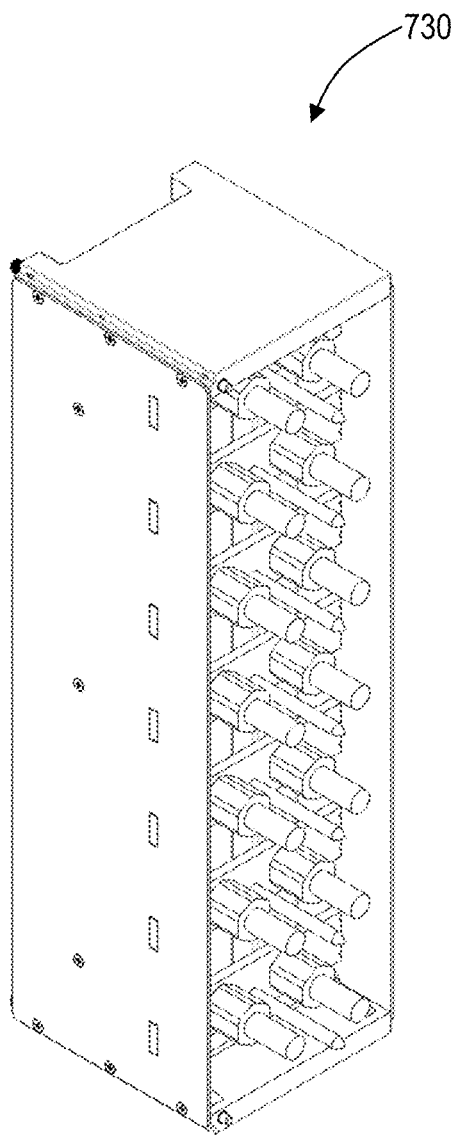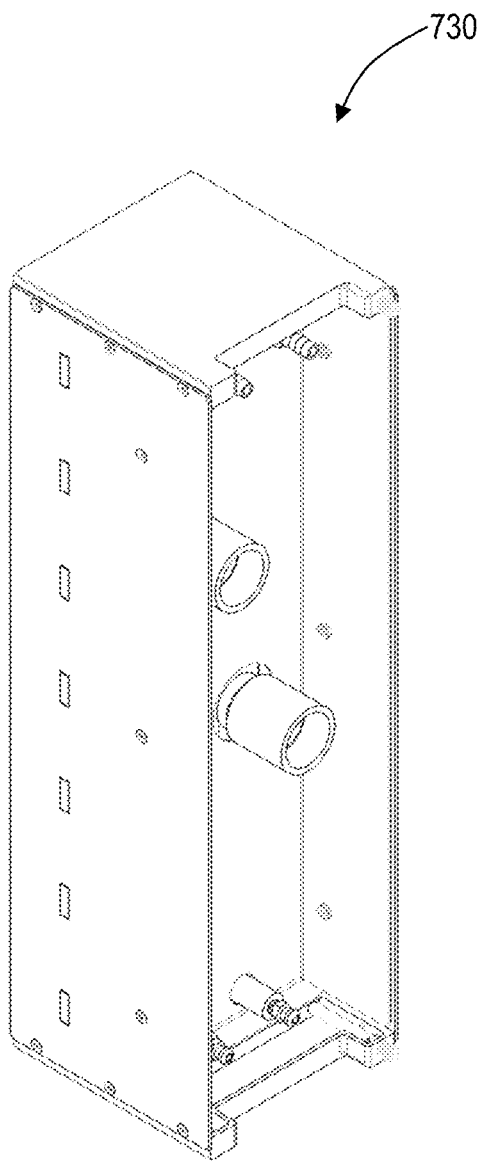
FIG. 51  FIG. 52

HYBRID AIR/LIQUID-COOLED NETWORK ELEMENT, COOLANT DISTRIBUTION MANIFOLD BOX FOR USE IN A HYBRID AIR/LIQUID-COOLED NETWORK ELEMENT, AND METHOD FOR CONVERTING AN AIR-COOLED NETWORK ELEMENT TO A HYBRID AIR/LIQUID-COOLED NETWORK ELEMENT

CROSS-REFERENCE TO RELATED APPLICATION(S)

The present disclosure is a continuation-in-part (CIP) of U.S. patent application Ser. No. 17/941,140, filed Sep. 9, 2022, which is a CIP of U.S. patent application Ser. No. 17/071,073, filed Oct. 15, 2020, which claims priority to U.S. Provisional Patent Application No. 62/915,187, filed Oct. 15, 2019, and U.S. Provisional Patent Application No. 63/039,936, filed Jun. 16, 2020, the contents of each of which are incorporated by reference in their entirety.

FIELD OF THE DISCLOSURE

The present disclosure generally relates to networking hardware. More particularly, the present disclosure relates to systems and methods for liquid cooling high-density network pluggable modules for use in networking, storage, computing, and the like network elements, including pluggable optical modules as well as other types of pluggable modules that may not include optical interfaces.

BACKGROUND OF THE DISCLOSURE

Networks, data centers, cloud computing, and the like continue to grow. Equipment manufacturers must continue to deliver substantial continuous reductions in per-bit metrics related to cost, space, and power. Telecommunication, data communication, high-performance computing, and the like systems are typically deployed in physical hardware shelves, chassis, rack-mounted units ("pizza boxes"), cabinets, etc. that are mounted in racks or frames, freestanding, in cabinets, or the like. For example, typical racks or frames are either 19, 21, or 23 inches in practice. Various standards associated with racks or frames are described by Telecordia's GR-63-CORE, "NEBS Requirements: Physical Protection" (April 2012), European Telecoms Standards Institute (ETSI), American National Standard Institute (ANSI), etc. One downside to the continual improvement in the per-bit metrics is the increased heat, i.e., power dissipation and power density, and the corresponding cooling requirements (such as specified in the NEBS standards, note NEBS stands for Network Equipment-Building System). Even further, network operators want to deploy frames in data centers, telecom central offices, etc. as densely as possible, even further limiting cooling techniques, i.e., constraining airflow between the front and back Indeed, rapid advancements in fiber optic technology have increased transfer rates from 10 GbE to 40/100 GbE and currently advancing to 200/400 GbE and beyond. With the emergence of 100-400 GbE technologies, the creation of network architectures free from bandwidth constraints has been made possible. In addition, the small form factor of emerging pluggable optics allows a significant increase in the number of ports per package (i.e., port density). Pluggable optical modules may be defined by a Multi-Source Agreement (MSA), proprietary designs by individual vendors, etc. Generally, pluggable optical modules are configured to plug into a module or pizza box in a network element to provide optical interconnectivity. There are other types of modules that may include non-optical interconnectivity such as computing, routing, switching, etc. Those skilled in the art will recognize there are various types of modules that may be used in a network element, all of which are contemplated herein as pluggable modules.

The performance and longevity of pluggable modules depend on the ambient temperature they operate in and the thermal characteristics of the packaging of these devices. Although most field-programmable gate arrays (FPGAs), application-specific integrated circuit (ASICS), and other electronic components may need to be maintained below ~100° C., most optical components including pluggable optics may need to be maintained at a temperature below ~70° C. to ensure reliable transmission of data. The ever-increasing port density coupled with the low-temperature ratings associated with optical modules makes the thermal management of pluggable optics more and more challenging. Also, these modules are meant to be inserted and removed, so there are further physical challenges for cooling related to pluggable modules.

From an architectural perspective, the real estate in a 1 Rack Unit (1RU) faceplate of a network element is fixed. To increase the data transfer rate, more pluggable optics and faster pluggable optics need to be fit in a faceplate. For example, the industry target now is to fit 36×QSFPs in a 1RU faceplate (i.e., QSFP stands for Quad Small Form factor Pluggable and includes QSFP28 for 100 GbE, QSFP56 for 200 GbE, QSFP-DD (Double Density) for 400 GbE), while current products may fit 24×QSFP28 in a 1RU platform (aka. pizza box). Moving from 24×QSFP28 (100 GbE—heat dissipation: 3.5 W per pluggable module) to 36×QSFP-DD (400 GbE—heat dissipation: 24 W per pluggable module) creates a substantial thermal challenge with the present technologies. Increasing port density is an industry trend, and the abovementioned numbers are likely to increase in the future. To keep up with the trend, improved cooling is needed.

BRIEF SUMMARY OF THE DISCLOSURE

The present disclosure relates to systems and methods for liquid cooling high-density network pluggable modules for use in networking, storage, computing, and the like network elements, including pluggable optical modules as well as other types of pluggable modules that may not include optical interfaces. As described herein, pluggable modules can also be referred to as a plug. The present disclosure includes various embodiments of pluggable modules with liquid cooling approaches that provide substantial cooling enhancement relative to conventional air cooling approaches. This enables significantly higher power plugs can be cooled through the elimination of a dry contact interface and employment of liquid cooling. In various embodiments, the present disclosure includes various embodiments of liquid cooling approaches for pluggable modules. In an embodiment, the present disclosure includes a riding liquid coldpate with a coating on a housing of a pluggable module. This approach requires no changes to the pluggable module, which is advantageous in terms of compliance. In another embodiment, the present disclosure includes a common liquid coldpate shared amongst a plurality of pluggable modules each having a coating or plating on their housing. This approach also requires no changes and is useful where a network element has a large number of pluggable modules in a row. In a further embodiment, the present disclosure includes an integrated liquid-cooling approach that is integrated into the body of a pluggable module. This approach provides improved performance over the coldplate approaches but requires changes to the housing, i.e., updated MSA standardization. In yet another embodiment, the present disclosure includes liquid-cooled sled modules. Sled modules can provide additional functionality instead of just optical interconnections, e.g., computing, routing, switching, etc.

In an embodiment, a network element includes one or more modules each supporting one or more pluggable modules; and a first manifold and a second manifold each configured to connect to a conduit associated with a coldplate, wherein one of the first manifold and the second manifold is an inlet manifold and the other is an outlet manifold for a cooling fluid that flows through the conduit to cool the one or more pluggable modules. The one or more pluggable modules can be each a pluggable optical module that is one of compliant to any of XFP, SFP, XENPAK, X2, CFP, CFP2, CFP4, CFP8, QSFP, QSFP+, QSFP28, OSFP, and QSFP-DD and have a housing that has dimensions similar to any of XFP, SFP, XENPAK, X2, CFP, CFP2, CFP4, CFP8, QSFP, QSFP+, QSFP28, OSFP, and QSFP-DD.

The first manifold and the second manifold can be in a stacked configuration. The one or more modules can support the one or more pluggable modules in a plurality of rows, and the network element includes the first manifold and the second manifold separately for each of the plurality of rows. The one or more pluggable modules can include the coldplate one of integrated into a housing, immersed cooling, and direct processor cooling. The cooling fluid can include an electrically inert fluid that is either a single or two-phase flow. The one or more pluggable modules can each include fluid connectors configured to connect to the manifolds and electrical connectors. The fluid connectors can be configured to align the electrical connectors. The coldplate can be a riding coldplate that is configured to make thermal contact with the one or more pluggable modules once inserted. The network element can further include a spring configured to bias the one or more pluggable modules to the coldplate. The coldplate can include a thermal contact with a coating thereon. The conduit can include one or more bends/turns to form a bending, winding, tortuous, serpentine, or otherwise circuitous path. The coldplate can include fluid connectors that are configured to blind mate and quickly disconnect. The network element can further include leak mitigation. The network element can further include a sensor configured to detect leakage of the cooling fluid in the network element.

In another embodiment, a method includes providing a network element comprising one or more modules each supporting one or more pluggable modules; and a first manifold and a second manifold each configured to connect to a conduit associated with a coldplate, wherein one of the first manifold and the second manifold is an inlet manifold and the other is an outlet manifold for a cooling fluid that flows through the conduit to cool the one or more pluggable modules.

BRIEF DESCRIPTION OF THE DRAWINGS

The present disclosure is illustrated and described herein with reference to the various drawings, in which like reference numbers are used to denote like system components/method steps, as appropriate, and in which:

FIG. 1 is a front perspective diagram of the platform, FIG. 2 is a front view of the platform, FIG. 3 is a rear perspective diagram of the platform, and FIG. 4 is an internal cross-sectional diagram of the platform.

FIG. 5 is a perspective diagram of the module array. FIG. 6 is a top perspective diagram of a portion of the module array of FIG. 5. FIG. 7 is a side perspective diagram of the module cage and coldplate from the array of FIG. 5.

FIG. 36 is a perspective diagram of the module, and FIG. 37 is a side perspective diagram of the module of FIG. 36.

FIG. 38 is a front perspective diagram of the network element platform, and FIG. 39 is a rear perspective diagram of the network element platform.

FIG. 47 is a top perspective diagram of the liquid cooling cold block. FIG. 48 is a bottom perspective diagram of the liquid cooling cold block. FIG. 49 is a bottom perspective diagram of the liquid cooling cold block with cooling lines removed. FIG. 50 is a top diagram of the liquid cooling cold block with cooling lines connected to the rear manifold.

FIGS. 51-52 are a front perspective view (FIG. 51) and a rear perspective view of a coolant distribution manifold box.

DETAILED DESCRIPTION OF THE DISCLOSURE

Figure 1:
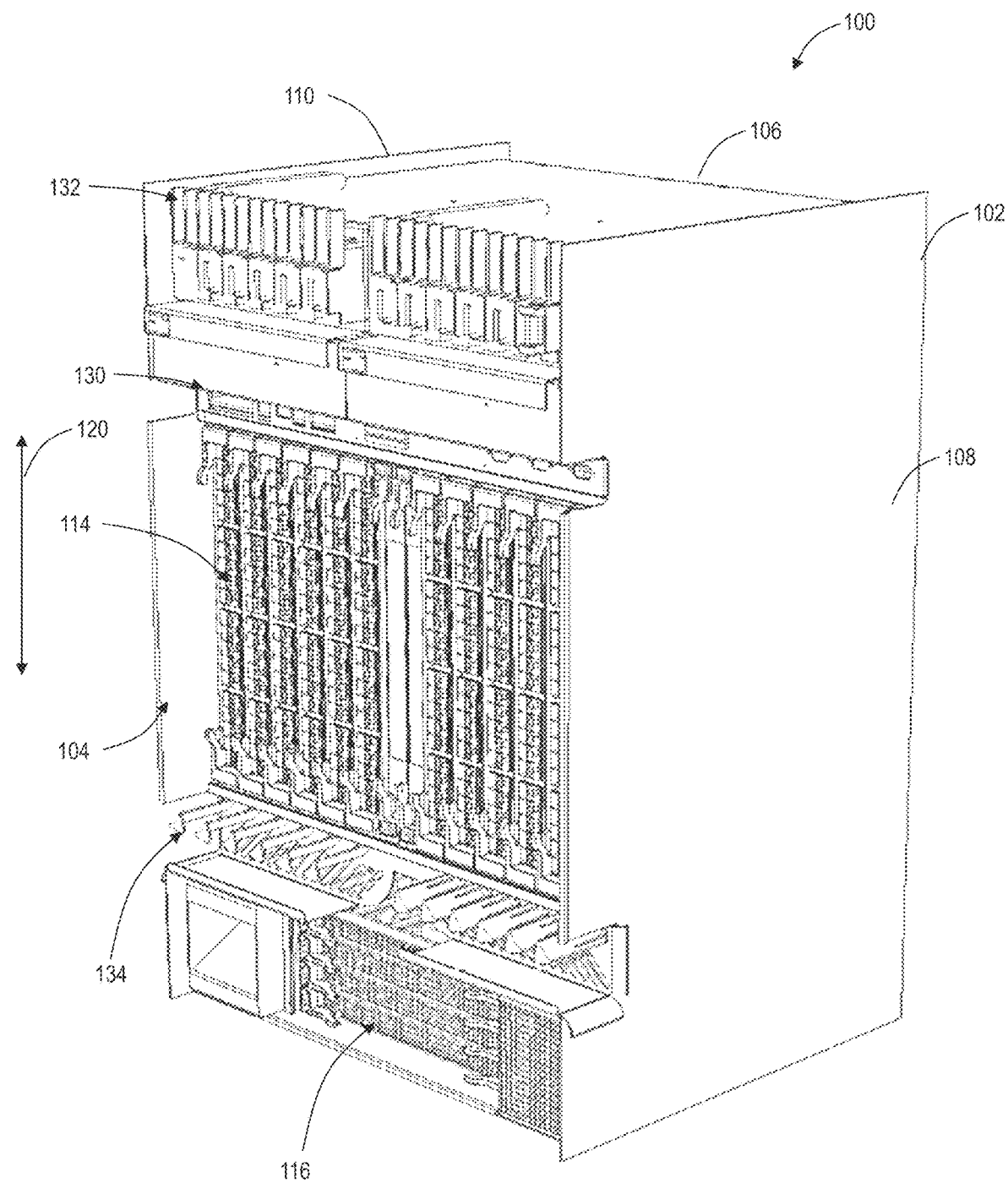
FIGS. 1-4 are various perspective diagrams of a platform.

Again, the present disclosure relates to systems and methods for liquid cooling high-density network pluggable modules for use in networking, storage, computing, and the like network elements, including pluggable optical modules as well as other types of pluggable modules that may not include optical interfaces. As described herein, pluggable modules can also be referred to as a plug. The present disclosure includes various embodiments of pluggable modules with liquid cooling approaches that provide substantial cooling enhancement relative to conventional air cooling approaches. This enables significantly higher power plugs can be cooled through the elimination of a dry contact interface and employment of liquid cooling. In various embodiments, the present disclosure includes various embodiments of liquid cooling approaches for pluggable modules. In an embodiment, the present disclosure includes a riding liquid coldpate with a coating on a housing of a pluggable module. This approach requires no changes to the pluggable module, which is advantageous in terms of compliance. In another embodiment, the present disclosure includes a common liquid coldpate shared amongst a plurality of pluggable modules each having a coating on their housing. This approach also requires no changes and is useful where a network element has a large number of pluggable modules in a row. In a further embodiment, the present disclosure includes an integrated liquid-cooling approach that is integrated into the body of a pluggable module. This approach provides improved performance over the coldplate approaches, but requires changes to the housing, i.e., updated MSA standardization. In yet another embodiment, the present disclosure includes liquid-cooled sled modules. Sled modules can provide additional functionality instead of just optical interconnections, e.g., computing, routing, switching, etc.

In an embodiment, the present disclosure uses a module for multiple pluggable optics held by cages connected to a PCB. One or more coldplates can be positioned to thermally contact the pluggable optics to liquid-cool the pluggable optics. The coldplates can be separate from the pluggable optics with contact pressure between the pluggable optics and the coldplate, or the liquid cooling can be integrated into the pluggable optics, which removes the necessity to have a dry sliding interface between the coldplate and the pluggable optics that can increase thermal resistance. That is, the coldplate is an external add-on to a housing with the coldplate, including liquid cooling to a metal structure that can cool an adjacent housing. The integrated liquid cooling is built directly into a housing of the pluggable module. Due to the thermal properties of liquid solutions, even at low flow rates, the operating temperature of the liquid-cooled pluggable optics can be lower than the operating temperature of air-cooled pluggable optics in an ideal air-cooling condition. Further, with superior thermal properties of liquids, the space required for cooling can be minimized, which opens the door for more compact architectures, i.e., better than heat sinks and air cooling.

The coldplates are each connected to an inlet manifold and an exhaust manifold. Each of the coldplates, the inlet manifold, and the exhaust manifold can include connecting tubes. For the integrated cooling, the connecting tubes can be integral to the pluggable optics. For pluggable optics with integrated cooling, the connecting tubes can include blind mate quick connections/releases (liquid quick-disconnects) to allow for the pluggable optics to connect to the inlet and exhaust manifolds without allowing the fluid therein to leak. The connecting tubes for the riding coldplates or the connecting tubes for the inlet and exhaust manifolds can include integral flanges for connecting to the other of the connecting tubes for the coldplates or the connecting tubes for the inlet and exhaust manifolds. Such a configuration simplifies the connection between the coldplates and the manifolds (inlet and exhaust) and eliminates the need for flyover cables, separate connectors, separate fittings, and the like, which can reduce the cost of manufacturing and can reduce the number of potential locations for leaks.

For the pluggable optics with integrated cooling, a connector of the module can include a common body that integrates both the liquid and electrical connections. The connector is configured to connect to both electrical and liquid connections of the pluggable optic simultaneously. Furthermore, the liquid quick-disconnects can act as alignment pins (removing the need for separate alignment pins) and can help control tolerance between the liquid and electrical connections.

In embodiments, the pluggable optics with integrated cooling can include one or more of an integrated coldplate, immersion cooling with dielectric fluid, direct processor liquid cooling with a dielectric fluid, liquid cooling for the electrical connections, and cooling to and beyond the faceplate. With such cooling, more power can be delivered to the pluggable optics allowing for an increase in the pluggable optics operating power and providing a decrease in the touch temperature of the case.

Also, the present disclosure utilizes various terms in the art such as module and card. Those of ordinary skill in the art will recognize these terms may be used interchangeably. Further, these do not require removability. That is, a module or card may be fixed in a platform. On the other hand, an interface card or a pluggable module (again, these terms may be used interchangeably) is selectively removable from a cage, slot, etc. in the platform, including in a module or card. Also, the term platform is used herein to denote a hardware device housing the modules or cards. The platform may include a shelf, chassis, rack-mounted unit, "pizza box," etc.

Example Network Element

Figure 2:
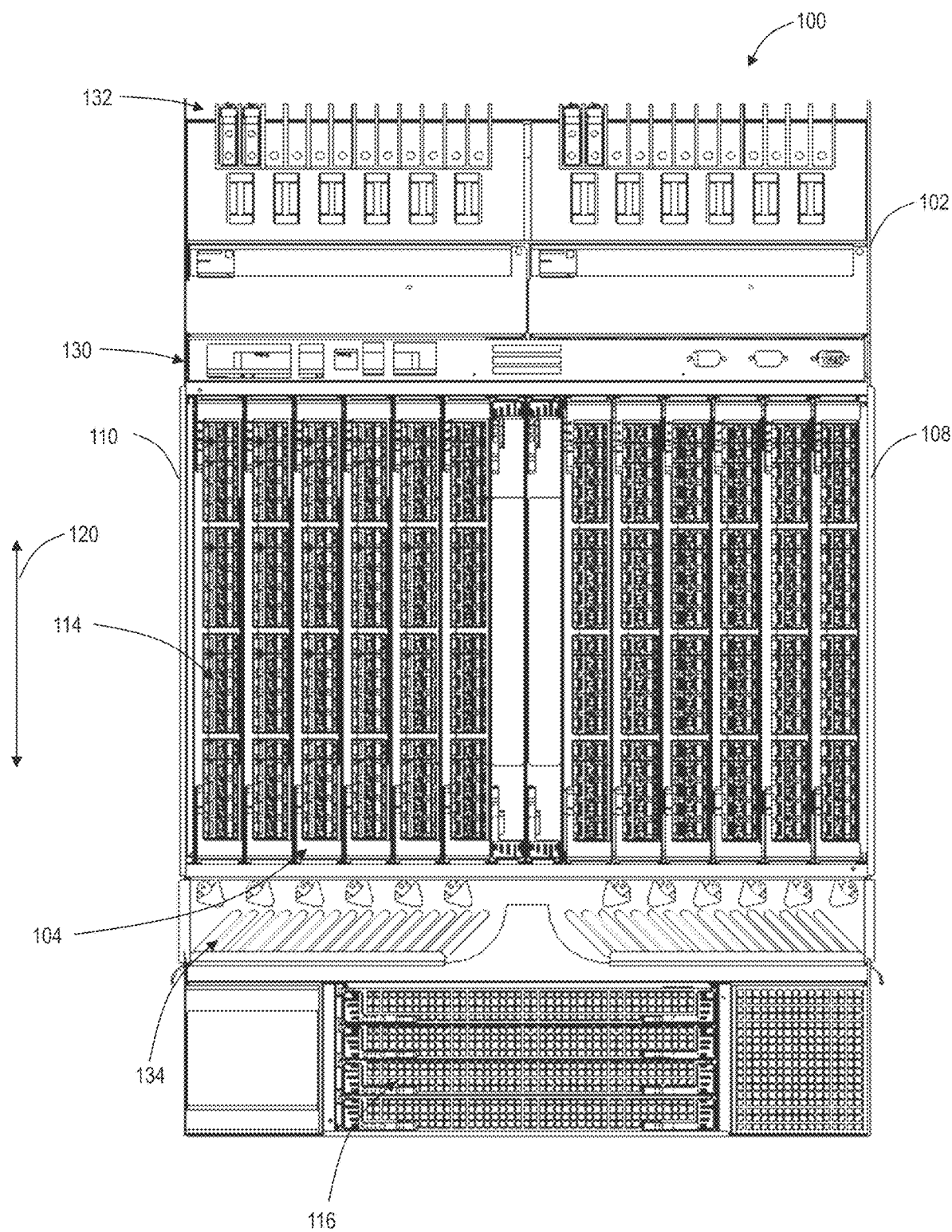
Figure 3:
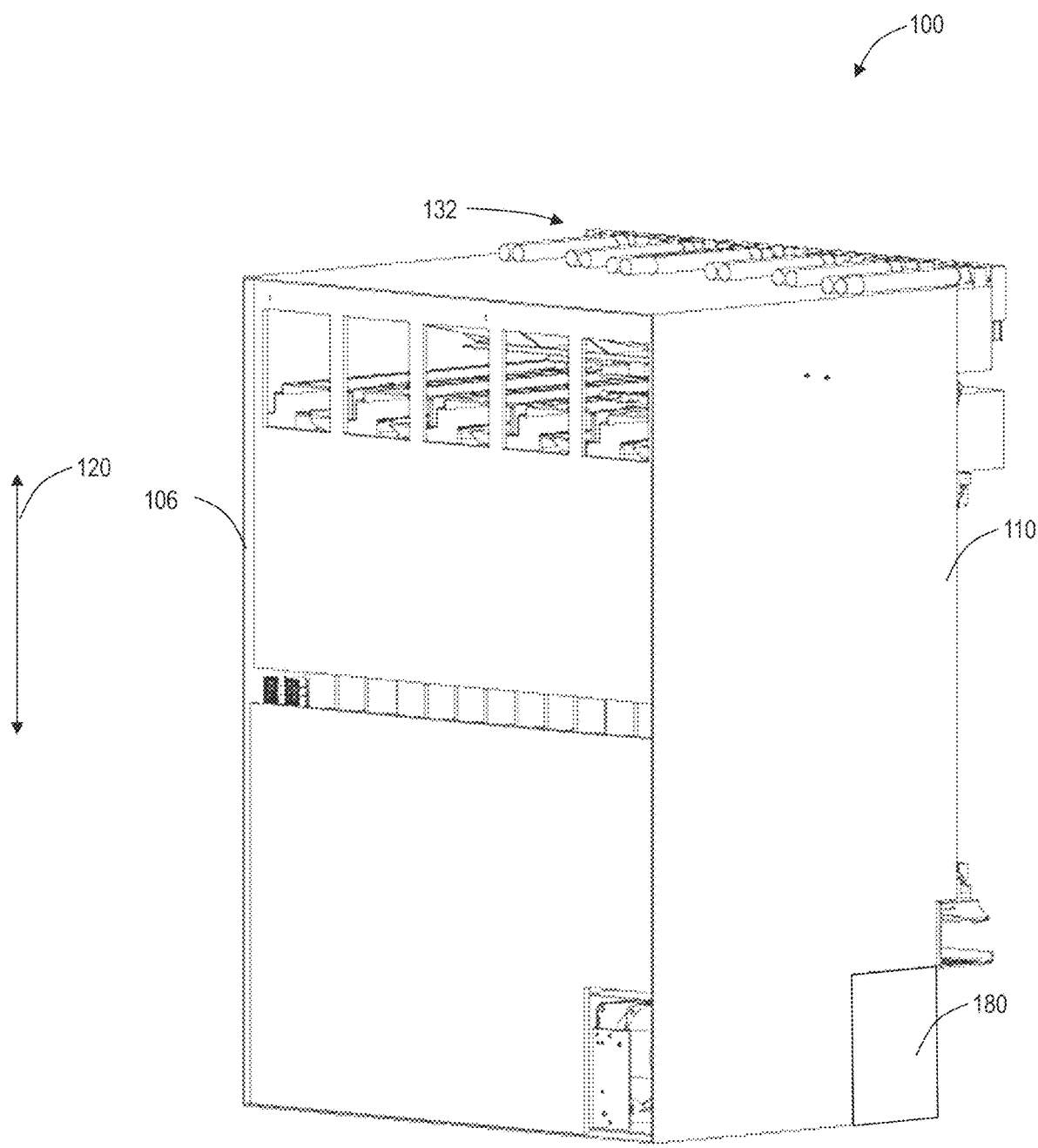
Figure 4:
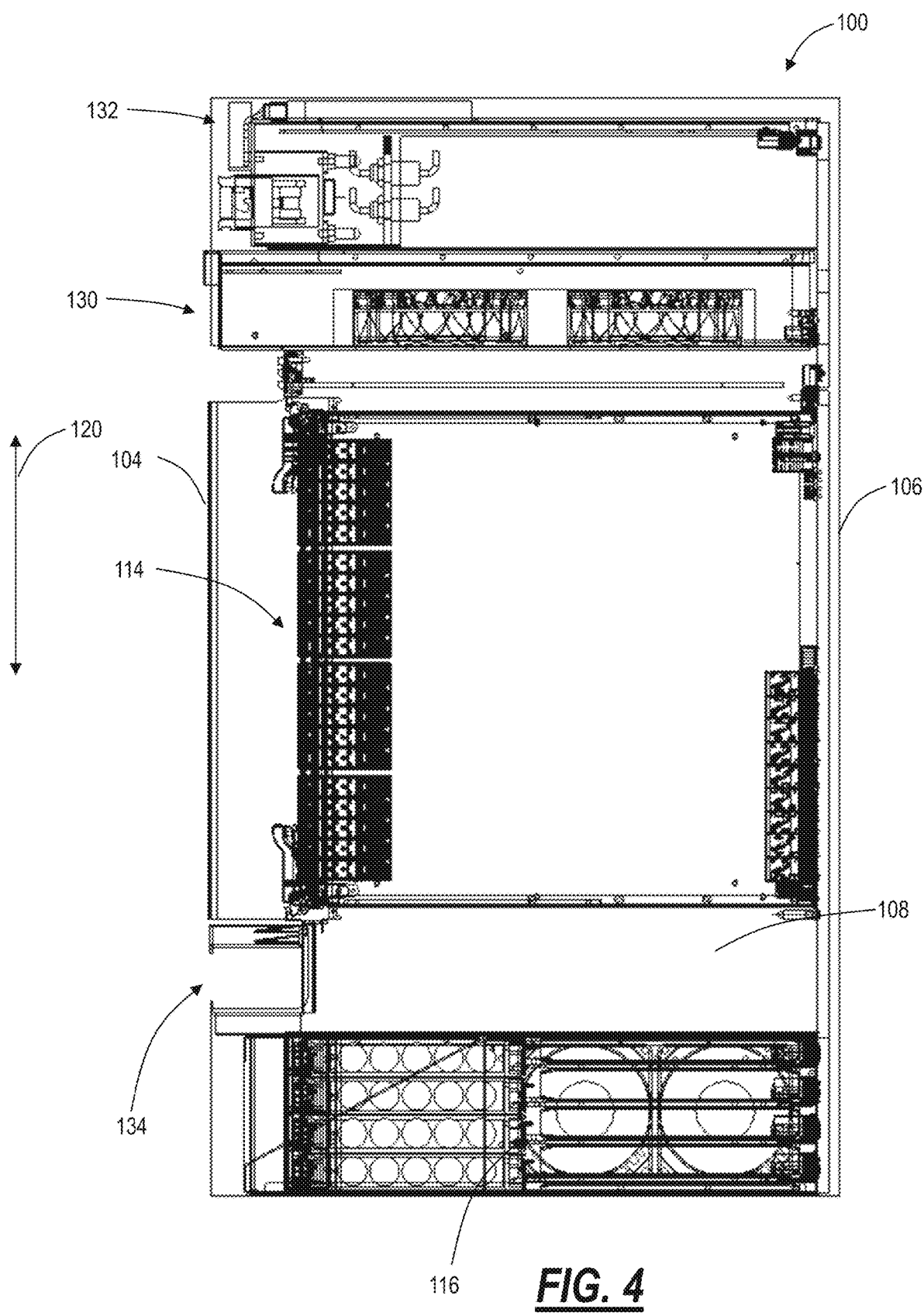

FIGS. 1-4 are various perspective diagrams of a network element 100. FIG. 1 is a front perspective diagram of the network element 100, FIG. 2 is a front view of the network element 100, FIG. 3 is a rear perspective diagram of the network element 100, and FIG. 4 is an internal cross-sectional diagram of the network element 100. FIGS. 1-4 are from commonly-assigned U.S. Pat. No. 9,769,959, issued Sep. 19, 2017, and entitled "HIGH DENSITY NETWORKING SHELF AND SYSTEM," the contents of which are incorporated herein by reference. The network element 100 can be a shelf, a system, a chassis, etc. forming a network element, a node, etc. in a network. The network element 100 can include front and rear air intake/exhaust without side ventilation, thereby maintaining NEBS compliance. Additionally, the network element 100 is a half-rack system that is scalable to a double (full rack) sized system. The network element 100 is presented as an example for illustration purposes. Those skilled in the art will recognize other physical embodiments are contemplated. That is, the present disclosure contemplates use with any hardware platform having pluggable modules.

In an embodiment, the network element 100 can be a network element that may consolidate the functionality of a Multi-Service Provisioning Platform (MSPP), Digital Cross-Connect (DCS), Ethernet and/or Optical Transport Network (OTN) switch, Dense Wave Division Multiplexing (DWDM) platform, etc. into a single, high-capacity intelligent switching system providing Layer 0, 1, and 2 consolidation. In another exemplary embodiment, the network element 100 can be any of an OTN Add/Drop Multiplexer (ADM), a SONET/SDH/OTN ADM, an MSPP, a DCS, an optical cross-connect, an optical switch, a router, a switch, a DWDM terminal, wireless backhaul terminal, an access/aggregation device, etc. That is, the network element 100 can be any digital and/or optical system with ingress and egress signals and switching therebetween of channels, timeslots, tributary units, packets, etc. utilizing OTN, SONET, SDH, Ethernet, IP, etc. In another embodiment, the network element 100 can be a high-rate Ethernet switch or router. In a further embodiment, the network element 100 can be a DWDM terminal. In yet another embodiment, the network element 100 can be a compute, wireless, storage, or another type of hardware platform. The key aspect of the network element 100 with the present disclosure and any other platform are the pluggable modules, via interface cards 114 in a cage.

The network element 100 includes a housing 102, which can refer to any shelf, rack, cabinet, case, frame, chassis, or other apparatus used to arrange and/or support a plurality of electronic/optical components such as removable cards, including modules with interface cards 114 and switch fabric cards 116. The housing 102 may be metal, plastic, or combination, or other suitable material and similar in construction to other housings, cabinets and/or racks used to hold electronic/optical components in place. Further, the housing 102 may be rack mounted in an ETSI, ANSI, etc. compliant rack or frame, as well as being deployed in a cabinet, etc. The housing 102 has a front side 104, a rear side 106 opposite the front side 104, a right side 108 adjacent to both the front side 104 and the rear side 106, and a left side 110 opposite the right side and adjacent to both the front side 104 and the rear side 106. Airflow in the network element 100 is between the front side 104 and the rear side 106; there may be no airflow through or between the sides 108, 110. Of course, other embodiments may include side-to-side airflow, top-to-bottom airflow, as well as combinations of different directions.

The housing 102 supports a set of interface cards 114 and, optionally, a set of switch fabric cards 116. The interface cards 114 are arranged in a first direction 120. The switch fabric cards 116 are arranged substantially orthogonally, i.e., perpendicular, to the first direction 120. In this embodiment, the interface cards 114 are vertically aligned, and the switch fabric cards 116 are horizontally aligned. The cards 114, 116 may optionally be surrounded by a separate metallic Faraday Cage, including, for example, a metal mesh screen. The orthogonal arrangement of the switch fabric cards 116 as compared with the interface cards 114 can form the recessed portion 40 as described herein.

The interface cards 114 can include selectively inserted pluggable optical modules with the liquid cooling approaches described herein. Again, the interface cards 114 can be referred to as line cards, line blades, I/O modules, etc. and can include a plurality of optical modules in the front. For example, the optical modules can be pluggable modules such as, without limitation, XFP, SFP, XENPAK, X2, CFP, CFP2, CFP4, CFP8, QSFP, QSFP+, QSFP28, OSFP, QSFP-DD, etc. XFP stands for 10 Gigabit small Form factor Pluggable. SFP stands for Small Form factor Pluggable. CFP stands for C Form factor Pluggable, and includes variants such as CFP2, CFP4, CFP8, CFP2-DCO (Digital Coherent Optics), etc. OSFP stands for Octal Small Form factor Pluggable. Further, the interface cards 114 can include a plurality of optical connections per module. The interface cards 114 can include wavelength division multiplexing interfaces, short-reach interfaces, and the like, and can connect to other interface cards 114 on remote network elements, end clients, edge routers, and the like.

From a logical perspective, the interface cards 114 provide ingress and egress ports to the network element 100, and each interface card 114 can include one or more physical ports. The optional switch fabric cards 116 are configured to switch channels, timeslots, tributary units, packets, cells, etc. between the interface cards 114. The interface cards 114 and/or the switch fabric cards 116 can include redundancy as well, such as 1:1, 1:N, etc. In an embodiment, the high-density network element 100 can be 15-16RU with 12 slots for line modules housing the interface cards 114 and 4 slots for the switch fabric cards 116. Here, the high-density network element 100 can dissipate between 600-750 W. Further, the switch fabric cards 116 can be single fabric or double fabric (with additional pins to the backplane from the single fabric). Additionally, the network element 100 contemplates operation in an ETSI, ANSI, 19", or 23" rack or frame.

The network element 100 can include common equipment 130, power connections 132, and a fiber manager 134. The common equipment 130 is utilized for Operations, Administration, Maintenance, and Provisioning (OAM&P) access; user interface ports; and the like. The network element 100 can include an interface for communicatively coupling the common equipment 130, the interface cards 114, and the switch fabric cards 116 therebetween. For example, the interface can be a backplane, midplane, a bus, optical or electrical connectors, or the like. The interface cards 114 are configured to provide ingress and egress to the network element 100.

Those of ordinary skill in the art will recognize the network element 100 can include other components which are omitted for illustration purposes, and that the systems and methods described herein are contemplated for use with a plurality of different network elements with the network element 100 presented as an example type of network device or hardware platform. For the high-density network element 100, other architectures providing ingress, egress, and switching therebetween are also contemplated for the systems and methods described herein. Those of ordinary skill in the art will recognize the systems and methods can be used for practically any type of network device, which includes interface cards 114 requiring significant cooling. For example, the present disclosure also contemplates a network element as an integrated rack unit, commonly referred to as a pizza box. The integrated rack unit may be 1-2RU in height and only include removable interface cards 114. Of note, the integrated rack unit has significantly less space for cooling relative to the network element 100. However, those skilled in the art should recognize the liquid cooling approaches described herein for pluggable modules are not limited to any specific implementation of the network element.

The network element 100 includes a housing with a front side, a rear side opposite the front side, a right side adjacent to both the front side and the rear side, and a left side opposite the right side and adjacent to both the front side and the rear side. One or more modules in the housing each including a plurality of cages supporting removable interface cards. The removable interface cards can be pluggable optical modules, sled modules, etc., which require cooling.

Riding Liquid Coldplate and Coating

Figure 5:
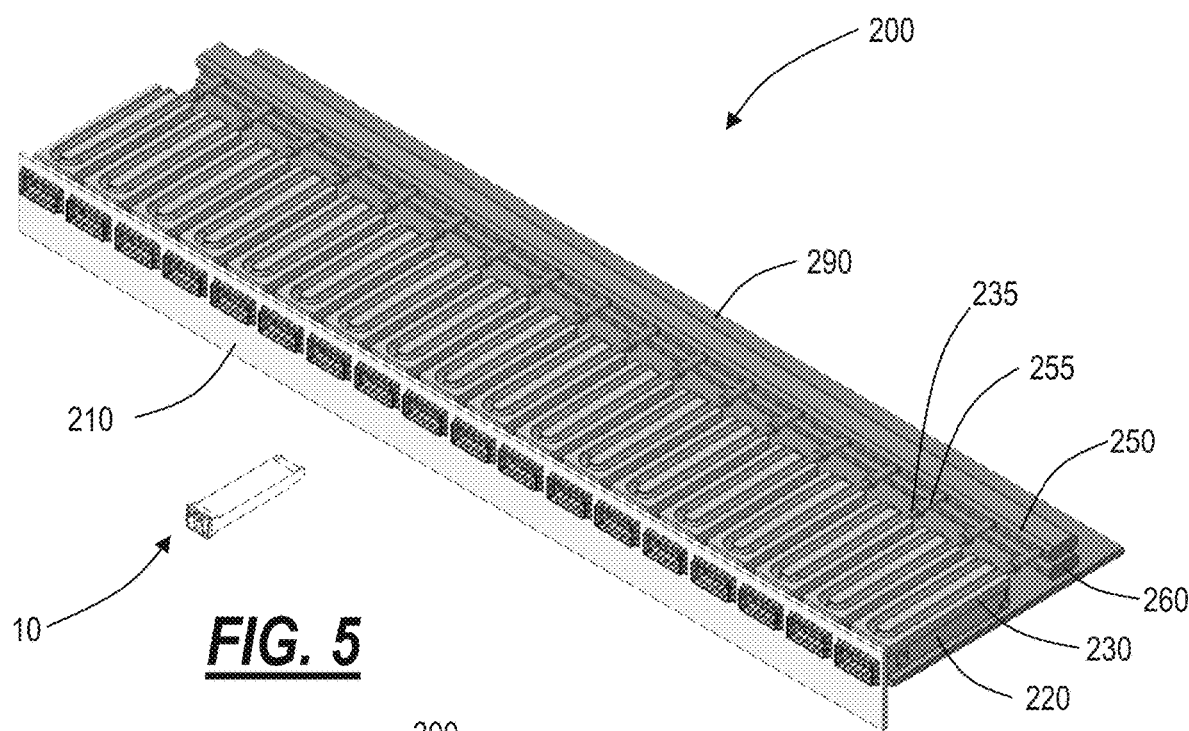
FIGS. 5-7 are various perspective diagrams of an array of a module cages with coldplates.
Figure 6:
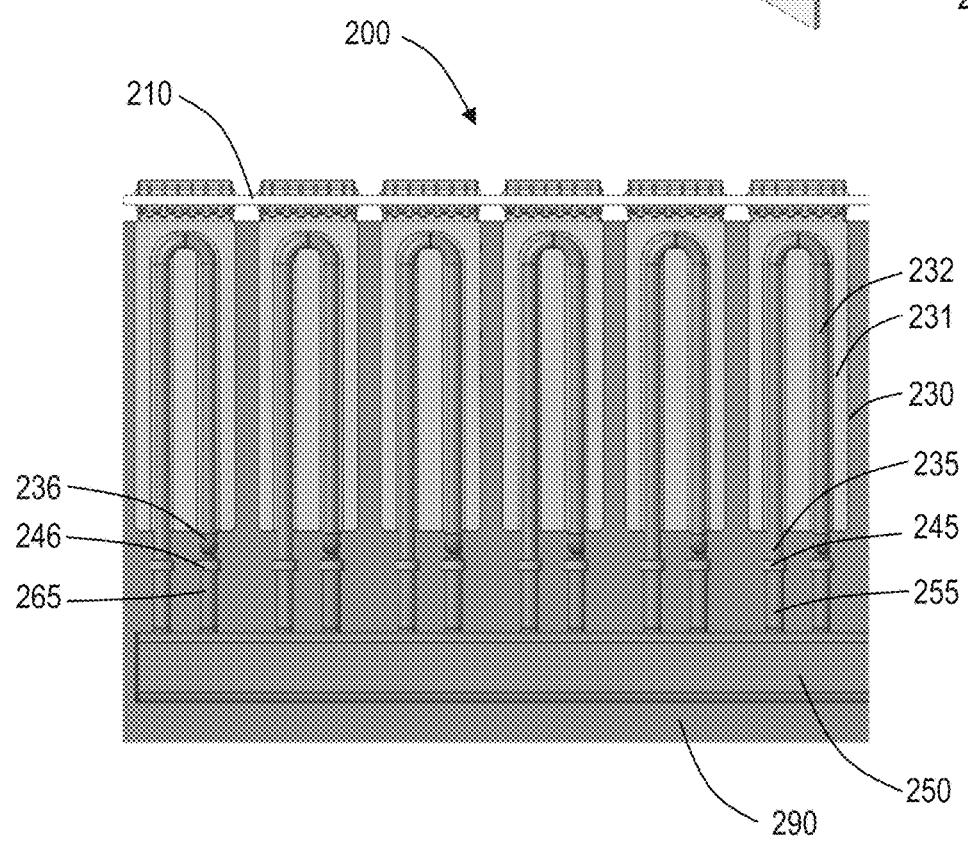
Figure 7:
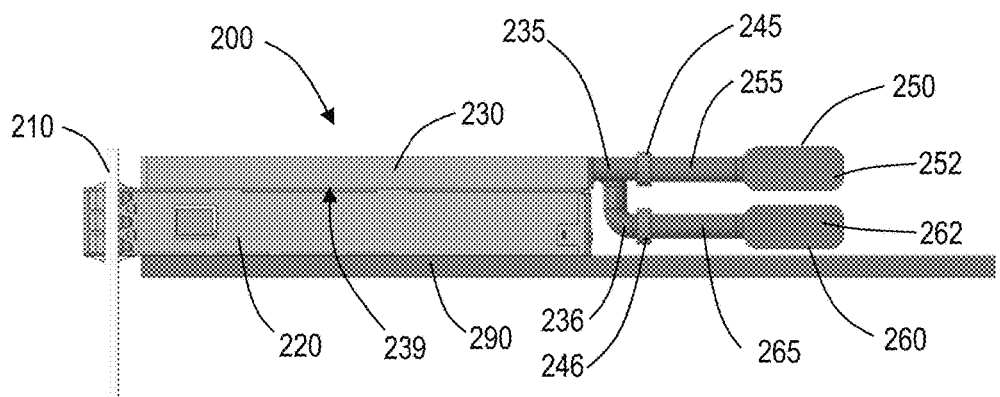
Figure 8:
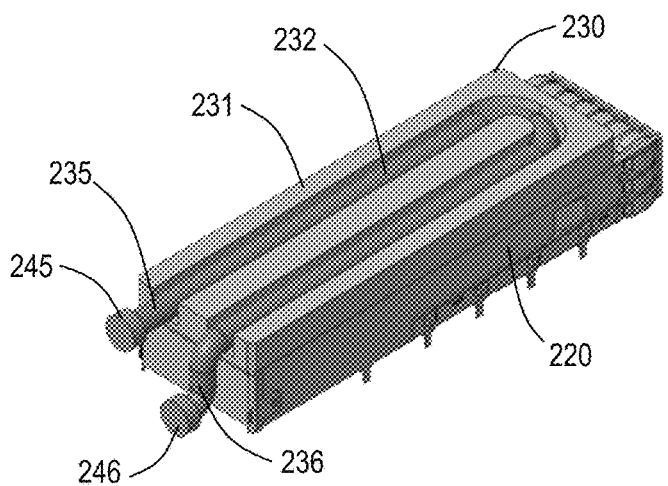
FIGS. 8 and 9 are perspective diagrams of a cage and module of the module of FIGS. 5-7 with a coldplate.
Figure 9:
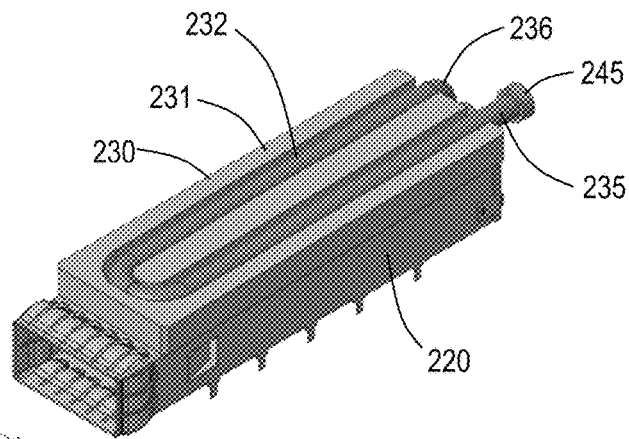
Figure 9:
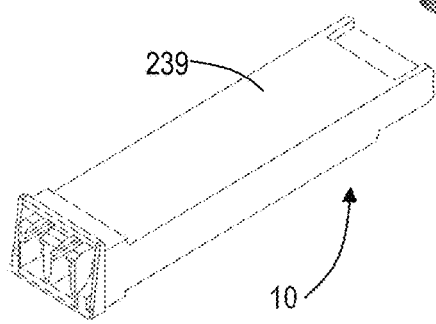
Figure 10:
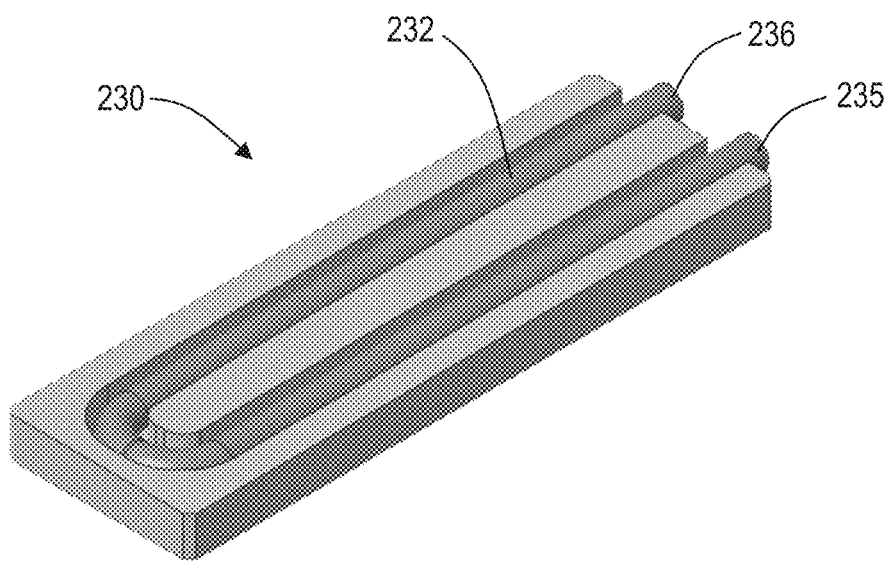
FIGS. 10 and 11 are perspective diagrams of the coldplate of FIGS. 5-9.
Figure 11:
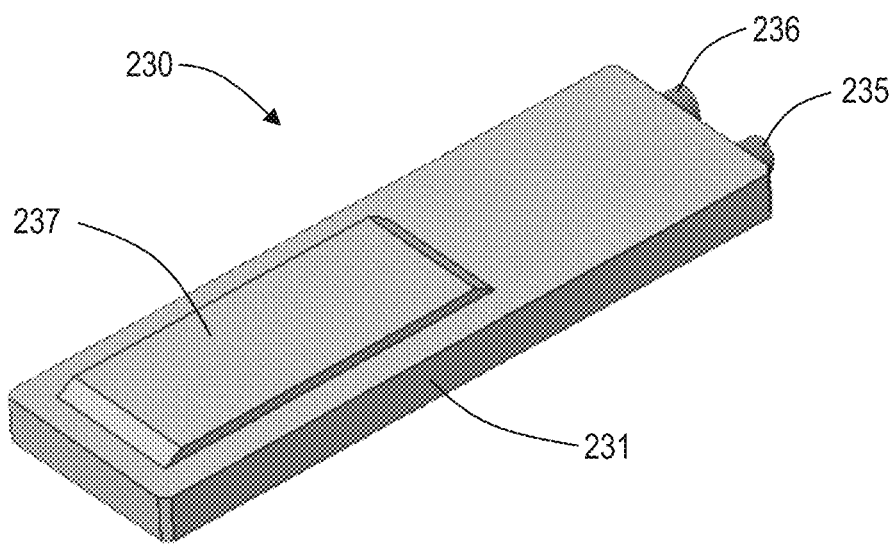
Figure 12:
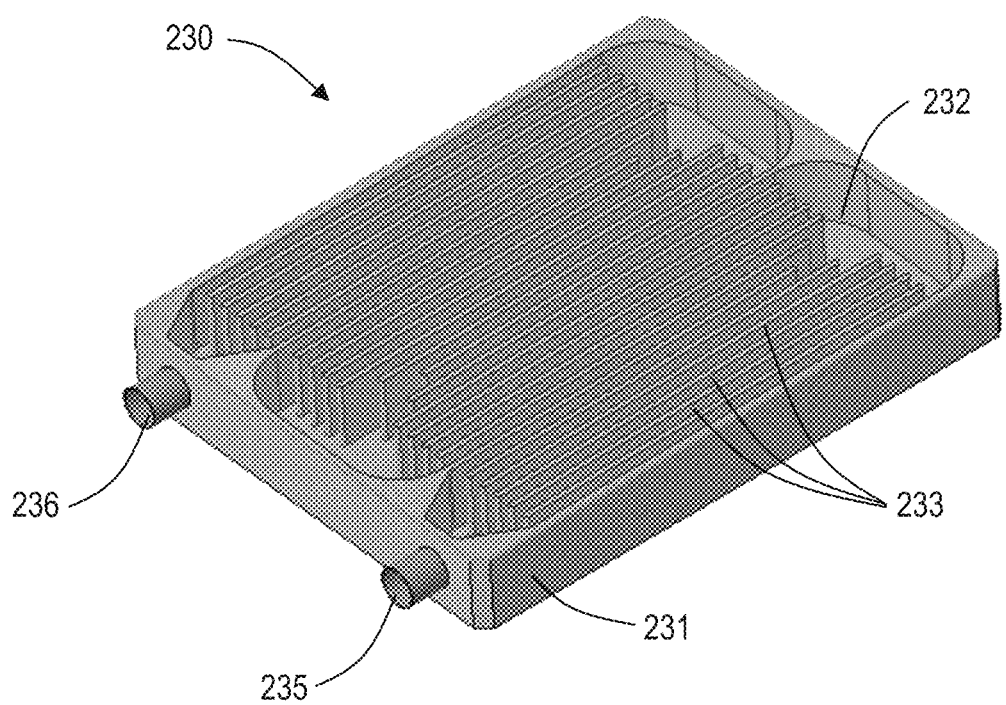
FIG. 12 is a perspective diagram of a coldplate.
Figure 13:
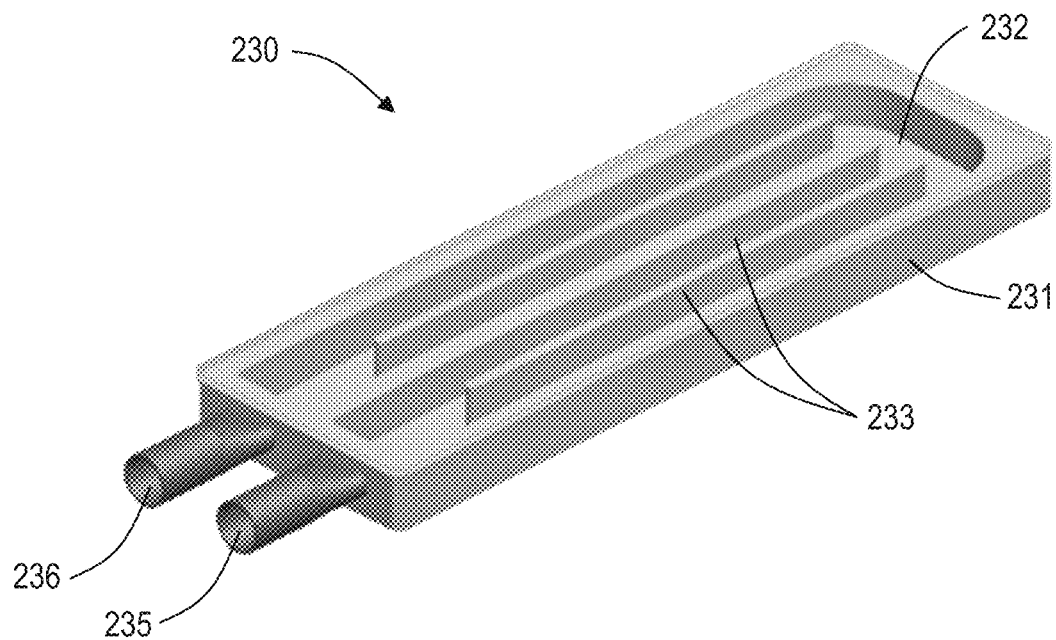
FIG. 13 is a perspective diagram of a coldplate.
Figure 14:
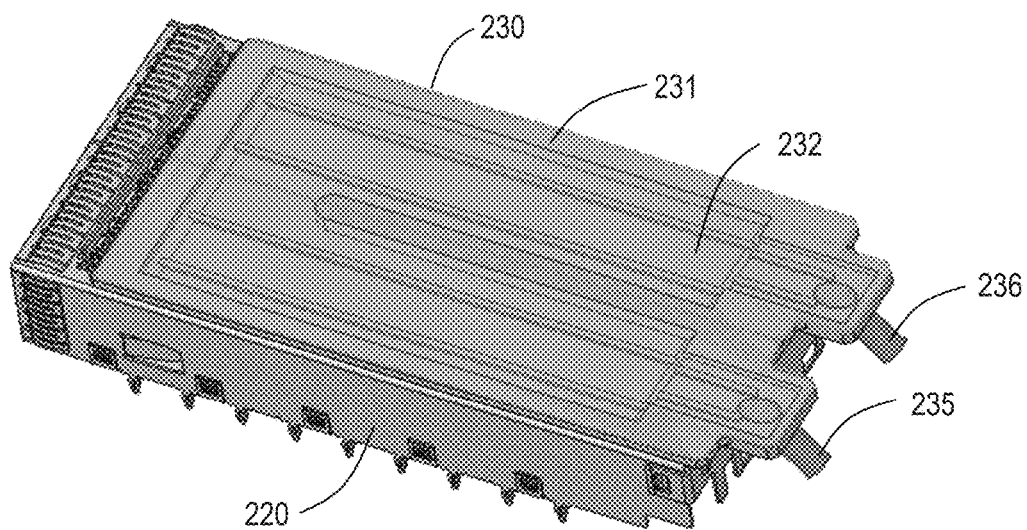
FIG. 14 is a perspective diagram of a coldplate.

FIGS. 5-7 are various perspective diagrams of a module 200 that supports multiple pluggable modules 10. FIG. 5 is a perspective diagram of the module 200. FIG. 6 is a top perspective diagram of a portion of the module 200 of FIG. 5. FIG. 7 is a side perspective diagram of the module 200 of FIG. 5. FIGS. 8 and 9 are perspective diagrams of a cage 220 and the pluggable module 10 that may be inserted in the module 200 of FIGS. 5-7 with a coldplate 230. FIGS. 10 and 11 are perspective diagrams of the coldplate 230 of FIGS. 5-9.

Specifically, the embodiment described herein relates to the coldplate 230, which is a riding coldplate, namely, it is not physically attached to the pluggable module 10. The pluggable module 10 can include a coating or a plating on its housing, or the coldplate can include the coating on its housing. The advantage of this approach is it does not require hardware changes to the pluggable module 10, and the coldplate 230 can be integrated in a corresponding cage or the like in the network element. The pluggable module 10 can be any of XFP, SFP, XENPAK, X2, CFP, CFP2, CFP4, QSFP, QSFP+, QSFP28, OSFP, QSFP-DD, and the like.

As can be seen in FIGS. 5-7, the module 200 can include a faceplate 210, a Printed Circuit Board (PCB) 290, multiple cages 220, and a heat exchange assembly. The heat exchange assembly includes a first manifold 250, a second manifold 260, and one or more coldplates 230 for cooling pluggable optics inserted into the cages 220. Also, this embodiment contemplates a network element with multiple cages 220 and a single liquid cooling system via the manifolds 250, 260.

Figure 15:
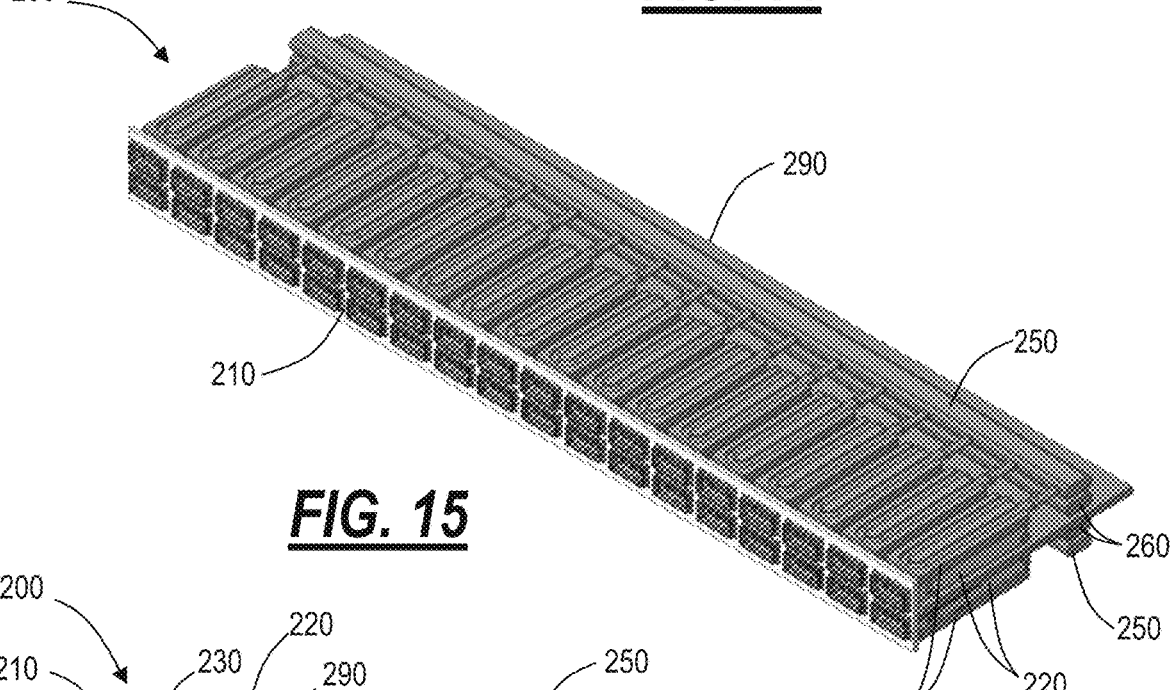
FIG. 15 is a perspective diagram of the module array with multiple rows of cages and coldplates.
Figure 16:
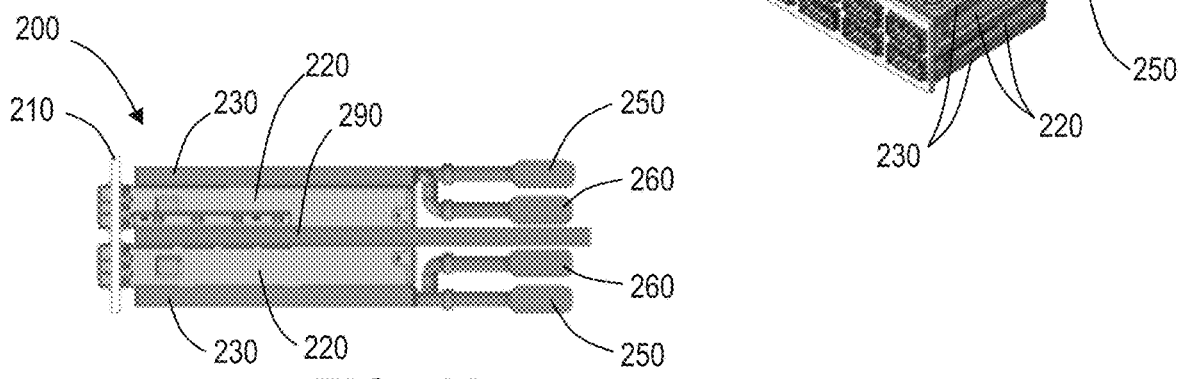
FIG. 16 is a side perspective diagram of the module array of FIG. 15.

The PCB 290 can be connected to the faceplate 210. The multiple cages 220 can be in a single row configuration or can be configured in multiple rows as shown in FIGS. 15 and 16. Each row of multiple cages 220 can include a separate heat exchange assembly.

The first manifold 250 can include a chamber 252 and multiple connecting ducts 255, and the second manifold 260 can include a chamber 262 and multiple connecting ducts 265. The chambers 252 and 262 branch into the multiple connecting ducts 255 and 265, respectively. The multiple connecting ducts 255 are integral to the chamber 252, and the multiple connecting ducts 265 are integral to the chamber 262. By being integral, the multiple connecting ducts 255 and 265 can be integrally formed with, metallurgically bonded with or otherwise permanently joined to the chambers 252 and 262, respectively. One of the first manifold 250 and the second manifold 260 is an inlet manifold for supply cooling liquid or fluid to the coldplates 230, while the other is an exhaust manifold for removing the cooling liquid from the coldplates 230. Generally, the techniques described herein use a fluid which can include a cooling liquid as well as other embodiments such as a two-phase liquid and gas flow. The first manifold 250 and the second manifold 260 can be in fluid communication with a reservoir for the cooling liquid and a pump. The cooling liquid can be a solution, such as propylene glycol solution, other solutions used for electronic cooling, and the like.

Referring to FIGS. 5-9, each coldplate 230 can include a plate 231, a first connector 235, a second connector 236, and a conduit 232. The plate 231 includes a mating surface 239 configured to be in thermal contact with an interface surface of the pluggable module 10 inserted into the corresponding cage 220. The plate 231 can be spring-loaded to the cage (i.e. using a spring clip) to create enough contact pressure at the interface of pluggable module and the coldplate 230 to minimize the thermal resistance and improve the heat flow path. The plate 231 at the mating surface 239 and the corresponding surface of the pluggable module 10 can include a coating thereon, such as a coating that improves the thermal resistance caused by the dry/sliding interface. The coating can eliminate small air gaps at the interface, which reduces thermal resistance. The coating can include surface treatment techniques used to reduce the thermal resistance at the dry/sliding interface. As described herein and as is known in the art, thermal contact means there are connection points between the pluggable module 10 and the coldplate 230 for the flow of heat, namely from the pluggable module 10 to the coldplate 230. The coating is used because the pluggable module 10 is removable from the cage 220.

The first connector 235 and the second connector 236 can be integral to the conduit 232 and can be integral to the plate 231. By being integral, the first connector 235 and the second connector 236 can be integrally formed with, metallurgically bonded with or otherwise permanently joined to the conduit 232 and/or the plate 231.

One of the first connector 235 and the corresponding connecting duct 255 can include an integral flange 245 that is integrally formed with, metallurgically bonded with or otherwise permanently joined to the one of the first connector 235 or corresponding connecting duct 255. The flange 245 is configured to directly receive the other of the first connector 235 and the corresponding connecting duct 255 for joining the first connector 235 to the corresponding connecting duct 255.

One of the second connector 236 and the corresponding connecting duct 265 can include an integral flange 246 that is integrally formed with, metallurgically bonded with or otherwise permanently joined to the one of the second connector 236 or corresponding connecting duct 265. The flange 246 is configured to directly receive the other of the second connector 236 and the corresponding connecting duct 265 for joining the second connector 236 to the corresponding connecting duct 265.

Due to the flanges 245 and 246 being integral to either the first and second connectors 235, 236 or to the corresponding connecting ducts 255, 265, the first connector 235 and the corresponding connecting duct 255 can be directly connected without any connectors and fittings, and the second connector 236 and the corresponding connecting duct 265 can be directly connected without connectors and fittings. These direct connections can simplify the heat exchange assembly and reduce assembly costs and potential leakage locations of the heat exchange assembly.

The first connector 235, the second connector 236, and/or the corresponding connecting ducts 255, 265 can be small tubes/pipes and can be made of a flexible material to accommodate the mobility of coldplates 230 when optics are plugged in and to accommodate any variance in dimensions of the first connector 235, the second connector 236, and the corresponding connecting ducts 255, 265 for forming the connections. In another embodiment, the first connector 235 and the flange 245 can be embedded copper tubes. The connections between the first connector 235, the second connector 236, and the corresponding connecting ducts 255, 265 can be permanently mated, which can reduce costs.

At least one of the first connector 235, the second connector 236, and the corresponding connecting ducts 255, 265 can include a single tube/pipe with multiple bends/elbows. The first manifold 250 and the second manifold 265 can be in a stacked configuration. The multiple bends/elbows allow the connection between the coldplate 230 and first and second manifolds 250, 260 that is offset from the coldplate to be formed without further flyover cables/connectors/fittings.

FIGS. 10-14 are perspective diagrams of a coldplate 230. Referring to FIGS. the conduit 232 is configured to cool the plate 231 with cooling liquid flowing therethrough. The conduit 232 can include one or more bends/turns to form a bending, winding, tortuous, serpentine, or otherwise circuitous path to ensure enough convection between the coldplate 230 and the cooling fluid to sufficiently cool the pluggable optics. Of note, the coldplate 230 can have different dimensions, shape, and structure of the conduit 232 based on the application and the underlying module that it is used with.

The conduit 232 can be a pipe, such as a copper pipe, that is metallurgically bonded to the plate 231, such as by soldering, can be formed directly in the plate 231, and the like. The conduit 232 can be flattened, which can reduce a height of the module 200 and can increase a thermal contact area between the conduit 232 and the plate 231, and thus, reduce thermal resistance.

The conduit 232 can be subdivided into multiple flow paths 233 for an entirety of the flow through the coldplate 230, can be subdivided into multiple flow paths 233 in sections of the coldplate 230, such as between bends, and the like.

As can be seen in FIG. 11, in some embodiments, the coldplate 230 includes a pedestal 237 that protrudes from the plate 231 and forms a dry/sliding interface between the pluggable module 10 and the coldplate 230. In embodiments, a thin coated layer is applied to an outer surface of the pedestal 237. Again, the thin coated layer can include surface treatment techniques used to reduce the thermal resistance at the dry/sliding interface.

FIG. 15 is a perspective diagram of the module 200 with multiple rows of cages 220 and coldplates 230. FIG. 16 is a side perspective diagram of the module 200 of FIG. 15. As noted above, each row of cages 220 can include separate heat exchange assemblies, with separate first and second manifolds 250, 260 and associated connections. Alternatively, a single set of first and second manifolds 250, 260 can be used, which are configured to connect to both rows of coldplates 230. This embodiment contemplates use in a network element supporting a large number of pluggable modules 10.

Of note, the riding coldplate approach advantageously allows use of liquid cooling techniques with any existing pluggable module 10, i.e., no change needed for compliance. This is because the coldplate 230 is external and makes thermal contact with the pluggable module 10. That is, the cage 220 includes the coldplate 230 instead of any heatsink.

Integrated Coldplate

Figure 17:
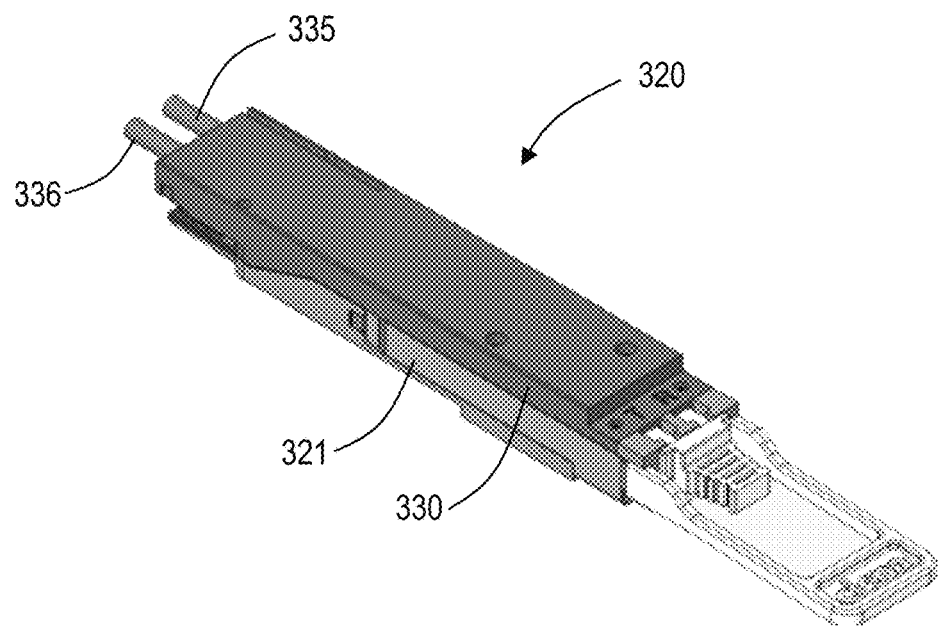
FIG. 17 is a perspective diagram of a pluggable optics module with an integrated coldplate.
Figure 18:
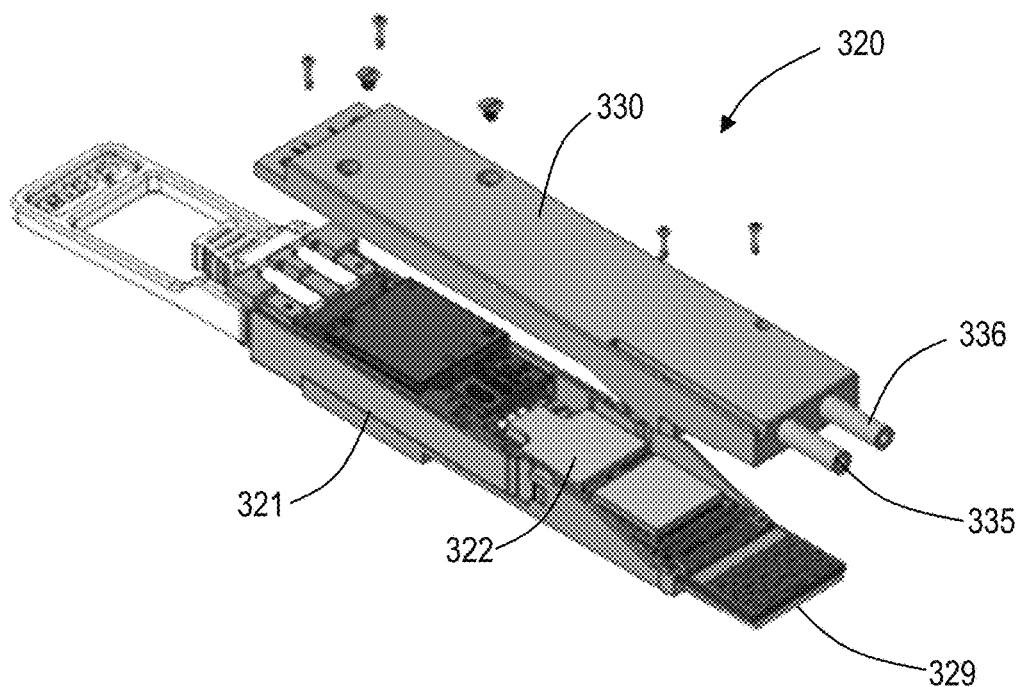
FIG. 18 is an exploded perspective diagram of the pluggable optics module with the integrated coldplate of FIG. 17.
Figure 19:
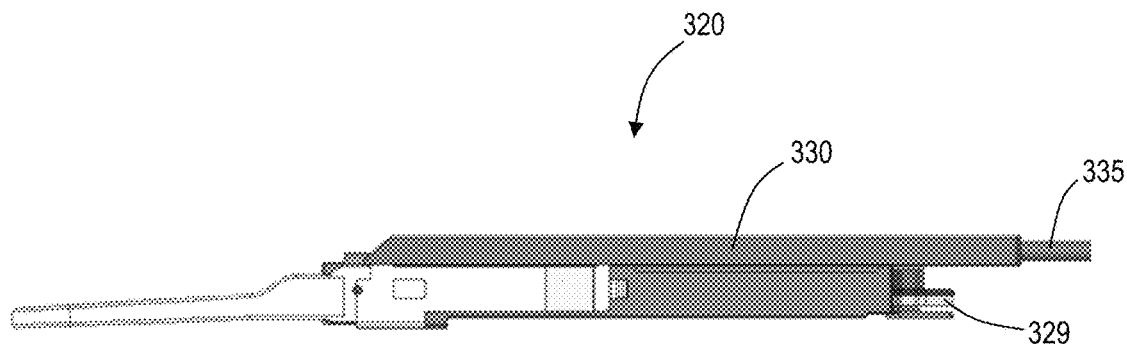
FIG. 19 is a side perspective diagram of the pluggable optics module with the integrated coldplate of FIG. 17.
Figure 20:
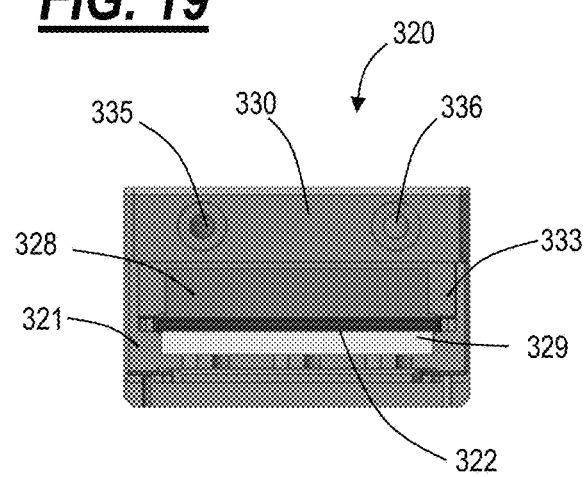
FIG. 20 is a back perspective diagram of the pluggable optics module with the integrated coldplate of FIG. 17.

FIG. 17 is a perspective diagram of a pluggable module 320 with an integrated coldplate 330. FIG. 18 is an exploded perspective diagram of the pluggable module 320 with the integrated coldplate 330 of FIG. 17. FIG. 19 is a side perspective diagram of the pluggable module 320 with the integrated coldplate 330 of FIG. 17. FIG. 20 is a back perspective diagram of the pluggable module 320 with the integrated coldplate 330 of FIG. 17. In embodiments, the pluggable module 320 (plug) is a high-density network pluggable optical module. That is, the pluggable module 320 can be similar to any of XFP, SFP, XENPAK, X2, CFP, CFP2, CFP4, QSFP, QSFP+, QSFP28, OSFP, QSFP-DD, and the like, but may require a new standard designation due to the housing change in the integration of the coldplate 330, e.g., QSFP-DD-LC where LC is Liquid Cooled. Of course, any other designation may be used, but the point to note is integration requires modification to the housing of the pluggable module 10, which requires new standardization.

Referring to FIGS. 17-20, the plug 320 includes a main body 321, circuitry 322, an integrated coldplate 330, a first plug fluid connector 335 and a second plug fluid connector 336. The circuitry 322, including the plug PCB, the processor, and the like, of the plug 320 is held by the main body 321. The integrated coldplate 330 connects to the main body 321 and is configured to provide cooling for the circuitry 322. In the embodiment illustrated, the integrated coldplate 330 acts as a cover for the plug 320 covering at least a portion of the circuitry 322 held within the main body 321. The plug 320 in FIGS. 17 and 18 is a QSFP-DD-like module with integrated liquid cooling. The plug 320 in FIGS. 19 and 20 is an OSFP-like module with integrated liquid cooling.

In some embodiments, the integrated coldplate 330 includes immersion cooling for the electrical components where the central region 328 of the plug 320 is filled with an electrically inert fluid. In one embodiment, the integrated coldplate 330 is configured to remove the heat from the electrically inert fluid. In another embodiment, the integrated coldplate 330 includes one or more flow paths through the central region 328 to directly cool the circuitry 322 with the electrically inert fluid flowing through the central region 328.

In some embodiments, the integrated coldplate 330 is configured to cool the processor indirectly with a surface contacting the processor or directly by interfacing with and providing cooling fluid through channels formed in the processor.

In embodiments, sides of the main body 321 extend upward beyond the circuitry 322 and provide support and mate with the integrated coldplate 330. As can be seen in FIG. 20, the integrated coldplate 330 can include a plate 331 and protrusions 333 extending down from the plate 331 into the main body 321. The protrusions 333 are oriented to position the integrated coldplate 330 relative to the main body 321 and can be used to secure the integrated coldplate 330 to the main body 321.

The plug 320 also includes a plug connector 329 that electronically connects the plug 320, and in particular, the circuitry 322, to the module that receives the plug 320. The plug connector 329 can be positioned at a back end of the plug PCB and can be part of the plug PCB. In embodiments, the integrated coldplate 330 is configured to directly cool one or more of the plug connector 329 and the connector of the module that is configured to receive the plug connector 329.

Figure 21:
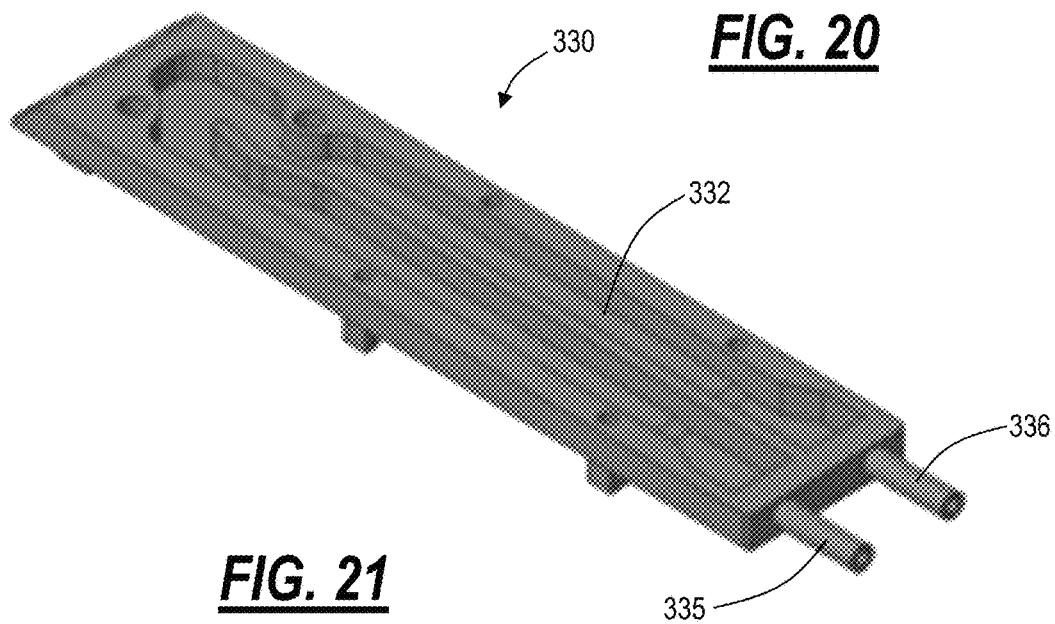
FIG. 21 is a perspective diagram of the integrated coldplate of FIGS. 17-20 without a top surface thereof.

FIG. 21 is a perspective diagram of the integrated coldplate 330 of FIGS. 17-19 without a top surface thereof. Referring to FIG. 21, the integrated coldplate 330 includes a conduit 332. The conduit 332 can include one or more bends/turns to form a bending, winding, tortuous, serpentine, or otherwise circuitous path to ensure enough convection between a body of the integrated coldplate 330 and the cooling fluid to sufficiently cool the plug 320 and the circuitry 322 therein. The conduit 332 can be subdivided into multiple flow paths for an entirety of the flow through the integrated coldplate 330, can be subdivided into multiple flow paths in sections of the integrated coldplate 330, such as between bends, and the like. In embodiments, the conduit 332 includes one of the conduits 232 illustrated in FIGS. 10, 12, and 13.

The first plug fluid connector 335 and the second plug fluid connector 336 are in fluid communication with opposite ends of the conduit 332, where one acts as an inlet and the other acts as an outlet for the conduit 332.

Figure 22:
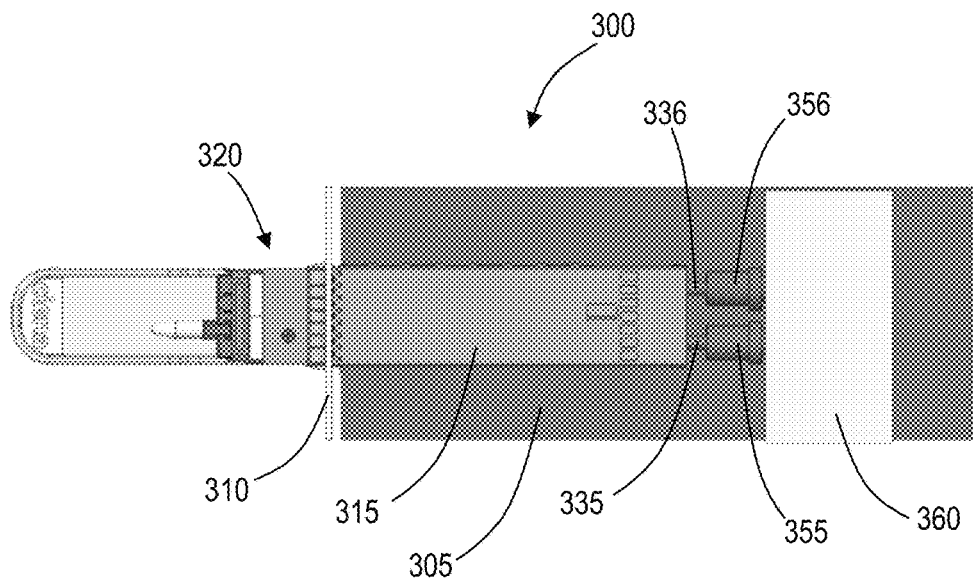
FIG. 22 is a top perspective diagram of a module with the pluggable optics module of FIGS. 17-20 in a cage.
Figure 23:
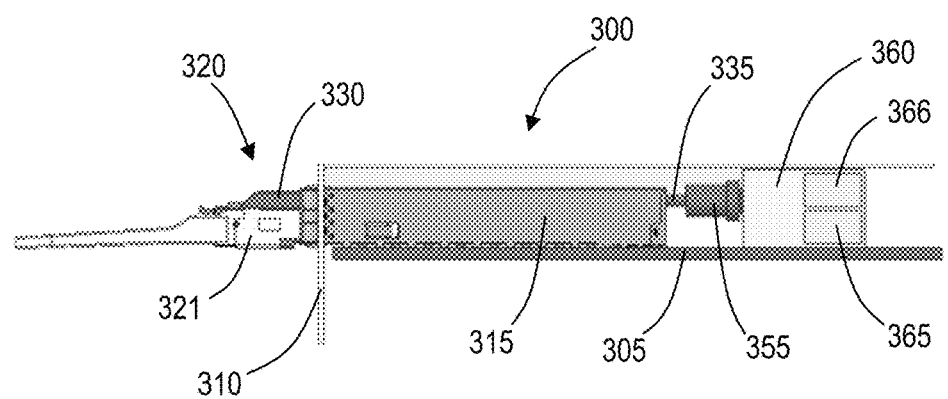
FIG. 23 is a side perspective diagram of the module of FIG. 22.
Figure 24:
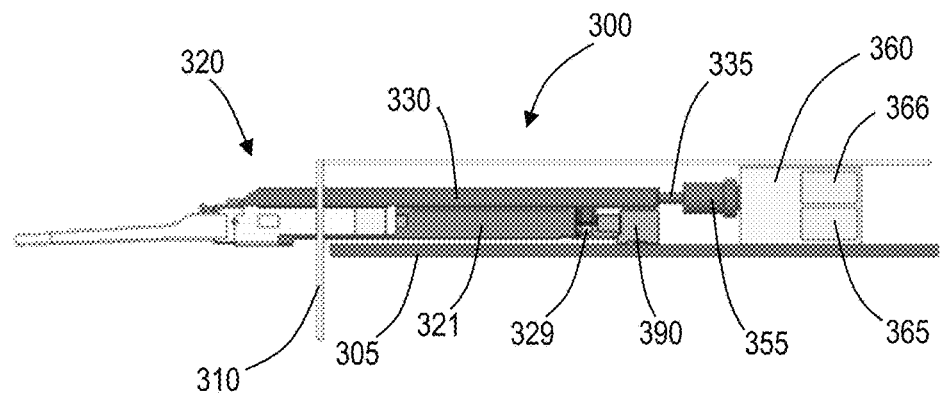
FIG. 24 is a side perspective diagram of the module of FIGS. 22 and 23 without the cage.
Figure 25:
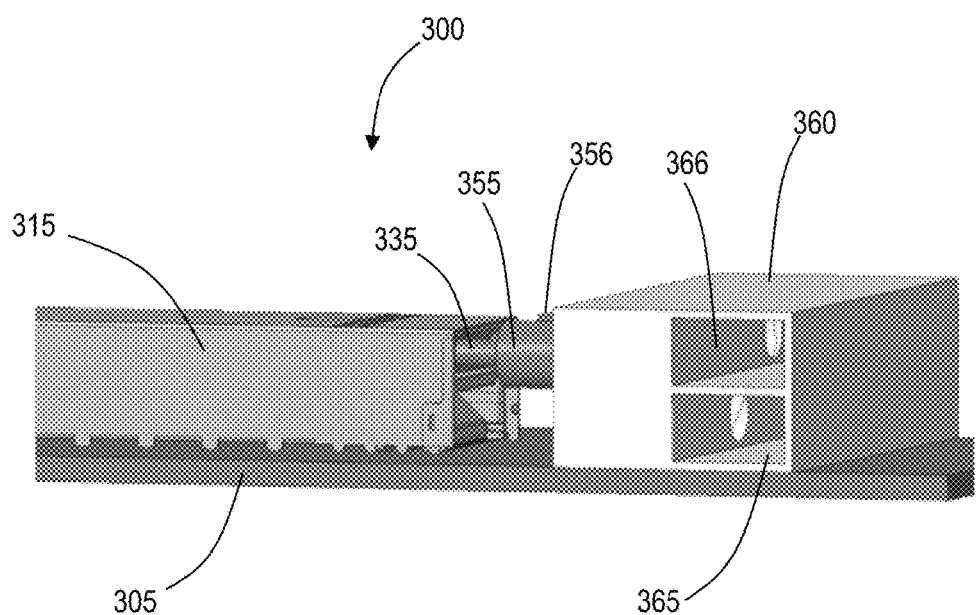
FIG. 25 is a perspective diagram of a portion of the module and cage of FIGS. 22-24.

FIG. 22 is a top perspective diagram of a module 300 with the pluggable module 320 of FIGS. 17-20. FIG. 23 is a side perspective diagram of the module 300 of FIG. 22. FIG. 24 is a side perspective diagram of the module 300 of FIGS. 22 and 23 without the cage 315. FIG. 25 is a perspective diagram of a portion of the module of FIGS. 22-24. The module 300, like the module 200, can be part of or inserted in a network element.

The module 300 is configured to receive the plug 320. The module 300 includes a main PCB 305, and a cage 320 secured thereto. The cage 320 is configured to hold the plug 320 in place. The module 300 also includes a manifold 360. The manifold 360 includes a first manifold flow path 365 and a second manifold flow path 366. While a single manifold 360 is illustrated, each of the flow paths can also be formed from separate manifolds. The manifold flow paths are configured to form an inlet flow path and an outlet flow path for the cooling fluid.

The manifold 360 also includes a first manifold fluid connector 355 and a second manifold fluid connector 356. The first manifold fluid connector 355 fluidly connects the first plug fluid connector 335 to the first manifold flow path 365, and the second manifold fluid connector 356 fluidly connects the second plug fluid connector 336 to the second manifold flow path 366. The fluid connection between the first manifold fluid connector 355 and the first plug fluid connector 335 and the fluid connection between the second manifold fluid connector 356 and the second plug fluid connector 336 can each be a quick disconnect. The quick disconnect is configured such that the fluid connections can be quickly broken, while properly sealing each of the first manifold fluid connector 355, the first plug fluid connector 335, the second manifold fluid connector 356, and the second plug fluid connector 336 to prevent leakage from both the integrated coldplate 330 and the manifold 360 during removal of the plug 320 from the module 300.

Referring to FIG. 24, the module 300 also includes a main PCB connector 390 that is configured to receive and form an electrical connection with the plug connector 329, thus, connecting the circuitry 322 of the plug 320 to the main PCB 305 of the module 300.

In embodiments, the fluid connection between the first manifold fluid connector 355 and the first plug fluid connector 335 and the fluid connection between the second manifold fluid connector 356 and the second plug fluid connector 336 can each be a blind mate. The blind mate therebetween can be figured to act as a guide pin such that the receiving of the first and second plug fluid connectors 335 and 336 by the first and second manifold fluid connectors 355 and 356 can align the plug 330 in the cage 315 such that the electrical connection between the main PCB connector 390 and the plug connector 329 is properly formed.

Figure 26:
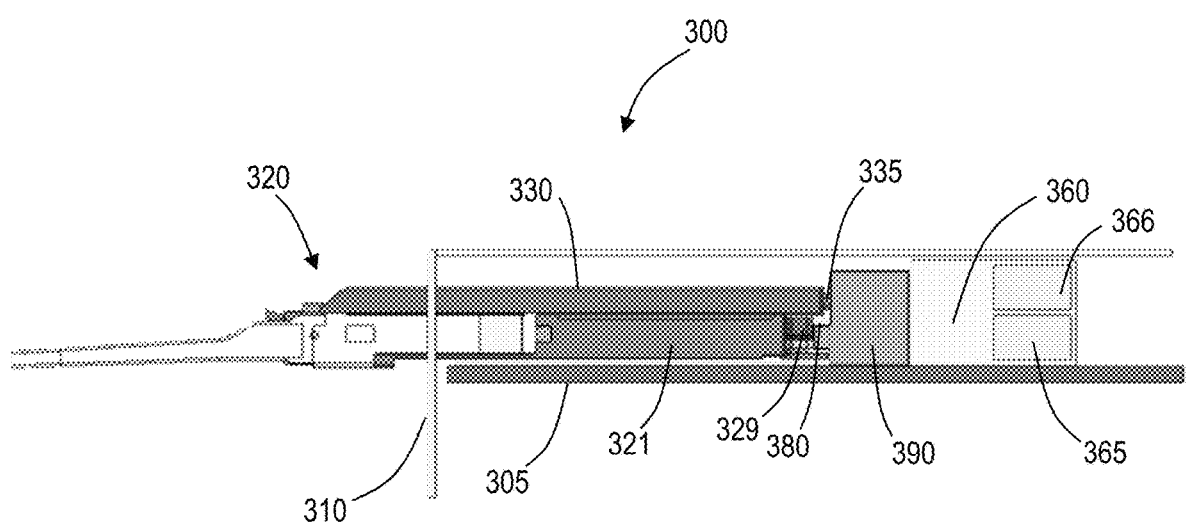
FIG. 26 is a side perspective diagram of an embodiment of the module without the cage.

FIG. 26 is a side perspective diagram of an embodiment of the module 300 without the cage 315. In the embodiment illustrated, electrical connector 390 includes the manifold fluid connectors. In the embodiment illustrated, the electrical connector 390 includes the female portion of the quick disconnect that receives the male first plug fluid connector 335 and the second plug fluid connector 336. In the embodiment illustrated, the electrical connector 390, including the manifold fluid connectors, are integrally formed as a unitary body, such as a single plastic mold or closely-aligned thermally-connected-mated components forming integral connections. Forming the electrical connector 390, including the manifold fluid connectors, as a unitary body provides a direct thermal path from the electrical connection to the cooling fluid at the manifold fluid connectors. This direct thermal path can allow the electrical connection to be cooled more effectively during the operation of the plug 320. In some embodiments, the unitary body includes cooling paths that bring the cooling fluid closer to the electrical connection for further cooling thereof. These paths can be part of or separate from the cooling path to the coldplate 330.

Again, the manifold fluid connectors can act as guide pins for aligning the electrical connection. With a unitary body making both the electrical and fluid connections with the plug, the electrical connector 390 can improve such alignment and can improve tolerancing between the electrical and fluid connectors.

Figure 27:
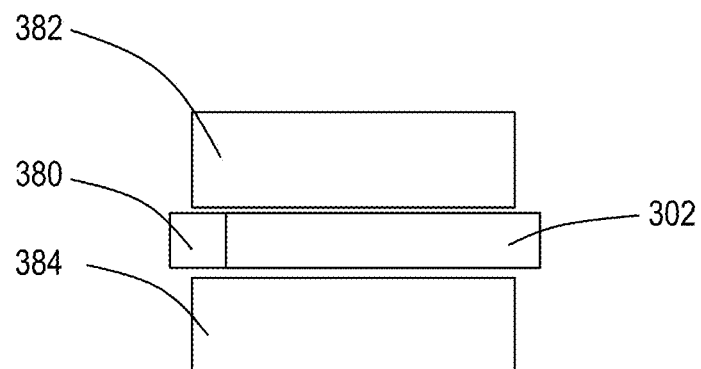
FIG. 27 is a schematic diagram of the connection zones of the module of FIGS. 22-26.

FIG. 27 is a schematic diagram of the connection zones of the module of FIGS. 22-26. In embodiments, the module 300 includes leak mitigation 380. The leak mitigation 380 is positioned between the fluid coupling zone 382, such as the fluid connections, and the electrical connection zone 384, such as the electrical connection between the electrical connector 390 and the plug connector 329. The leak mitigation 380 can be integrated into one or more components 302 of the module 300, such as the manifold 360, the electrical connector 390, the plug 320, the coldplate 330, the cage 315, and the like. In the embodiment shown in FIG. 26, the leak mitigation 380 is positioned at an upper surface of the unitary body of the electrical connector 390, below the fluid connection point. The leak mitigation 380 can be one or more of a depression in a surface, such as a channel, an absorbent material positioned below the fluid connection, such as above a surface of the electrical connector 390 or in a channel of the electrical connector 390 (as shown in FIG. 26), and the like. The leak mitigation 380 can be connected to, integrated in, or integrally formed with the component 302. Note, while described here with reference to the integrated approach, the leak mitigation 380 can be used with the riding coldplate, the common coldplate, etc.

Figure 28:
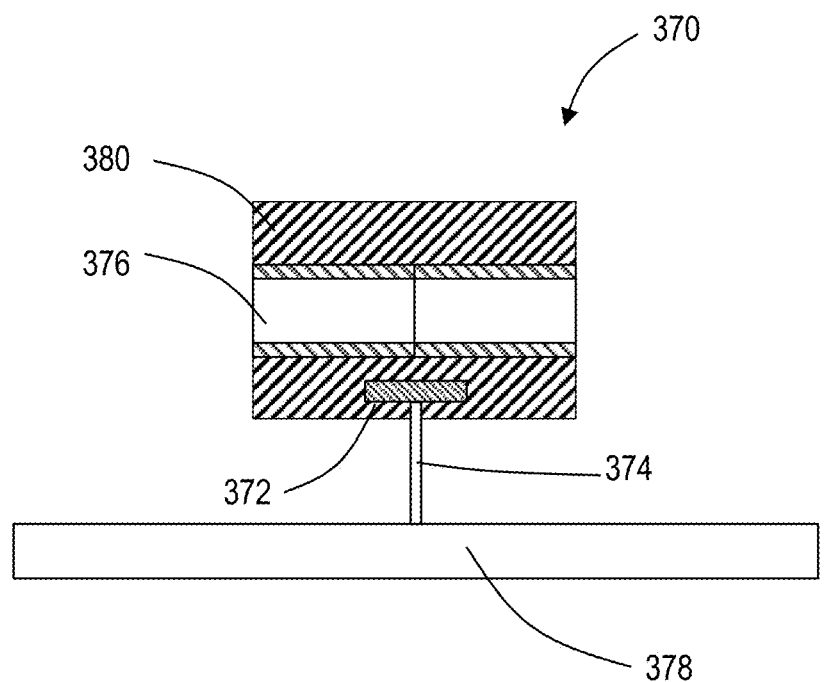
FIG. 28 is a schematic diagram of a leak mitigation system for the module.

FIG. 28 is a schematic diagram of a leak mitigation system 370 for the module 300. Referring to FIG. 28, in some embodiments, the leak mitigation 380 is a sleeve. The leak mitigation system 370 includes the sleeve 380, a sensor 372, and a connector 374. The sleeve 380 surrounds a liquid connection 376 of the module 300, such as the liquid connection between the first manifold fluid connector 355 and the first plug fluid connector 335 and the liquid connection between the second manifold fluid connector 356 and the second plug fluid connector 336. The sleeve 380 includes an absorbent material, at least on the interior thereof, that collects discharged liquid, can include channels for guiding any leaks away from electrical connections, and the like.

The sensor 374 is connected to one of the PCBs 378 in the module 300 via one or more connectors 374. In the embodiment illustrated, the sensor 374 is one of a humidity sensor and a vapor sensor positioned within the sleeve, such as within the absorbent material. Upon detection of a predetermined amount of humidity/vapor/moisture, one or more forms of leak mitigation, such as closing valves to prevent the flow of the coolant to the location of the leak and shutting down affected plugs 320 to prevent overheating of the plugs 320, raising an alarm to a network management system (NMS), element management system (EMS), etc., and the like, can be performed.

In some embodiments, the sensor is a pressure sensor that is used to detect a pressure drop in one of the various fluid flow paths throughout the system, which can be indicative of a leak. Upon detection of the leak, the one or more forms of leak mitigation can be employed.

In embodiments, multiple types of leak mitigation are used simultaneously. In some embodiments, multiple forms of leak mitigation overlap to form layers of mitigation. For example, the plug 330 can include leak mitigation that overlaps with leak mitigation included at the manifold 360 or electrical connector 390 when the plug is installed. Upon disconnect, the two forms of leak mitigation provide separate leak mitigation for the plug 330 and the manifold 360, respectively.

Sled Module

Figure 29:
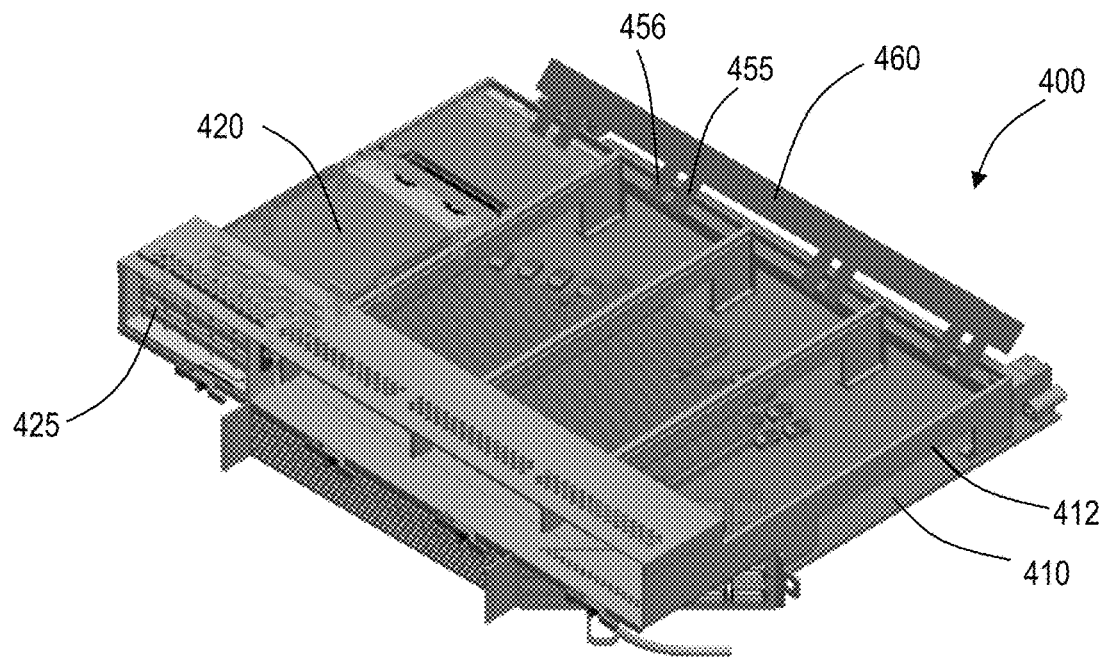
FIGS. 29 and 30 are perspective diagrams of an embodiment of a sled module.
Figure 30:
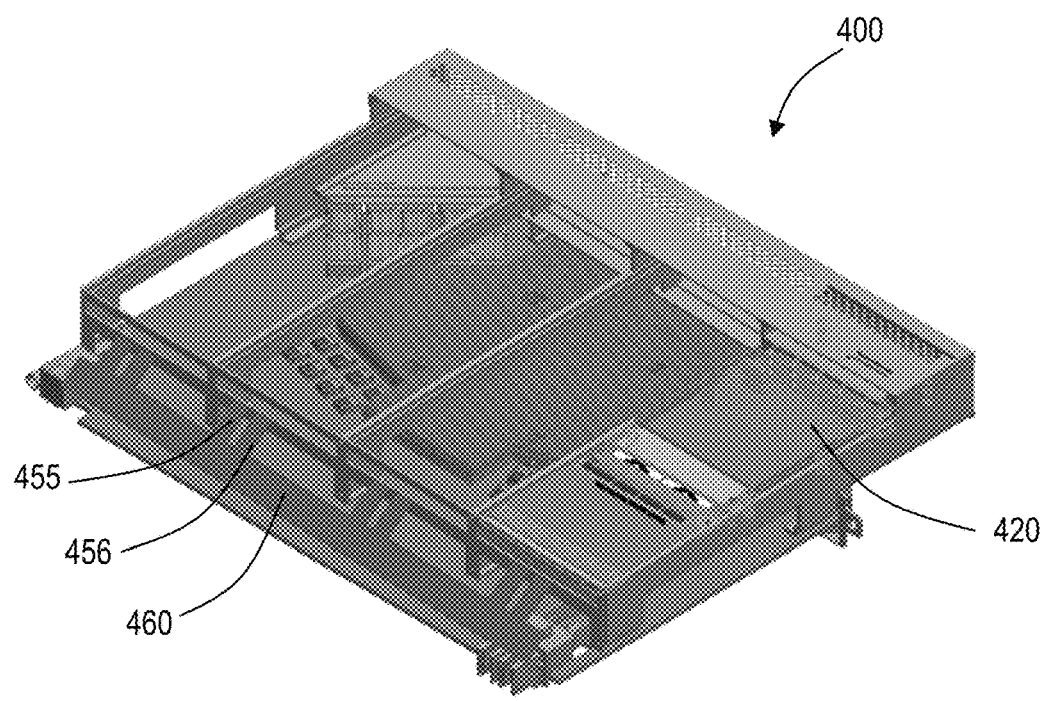
Figure 31:
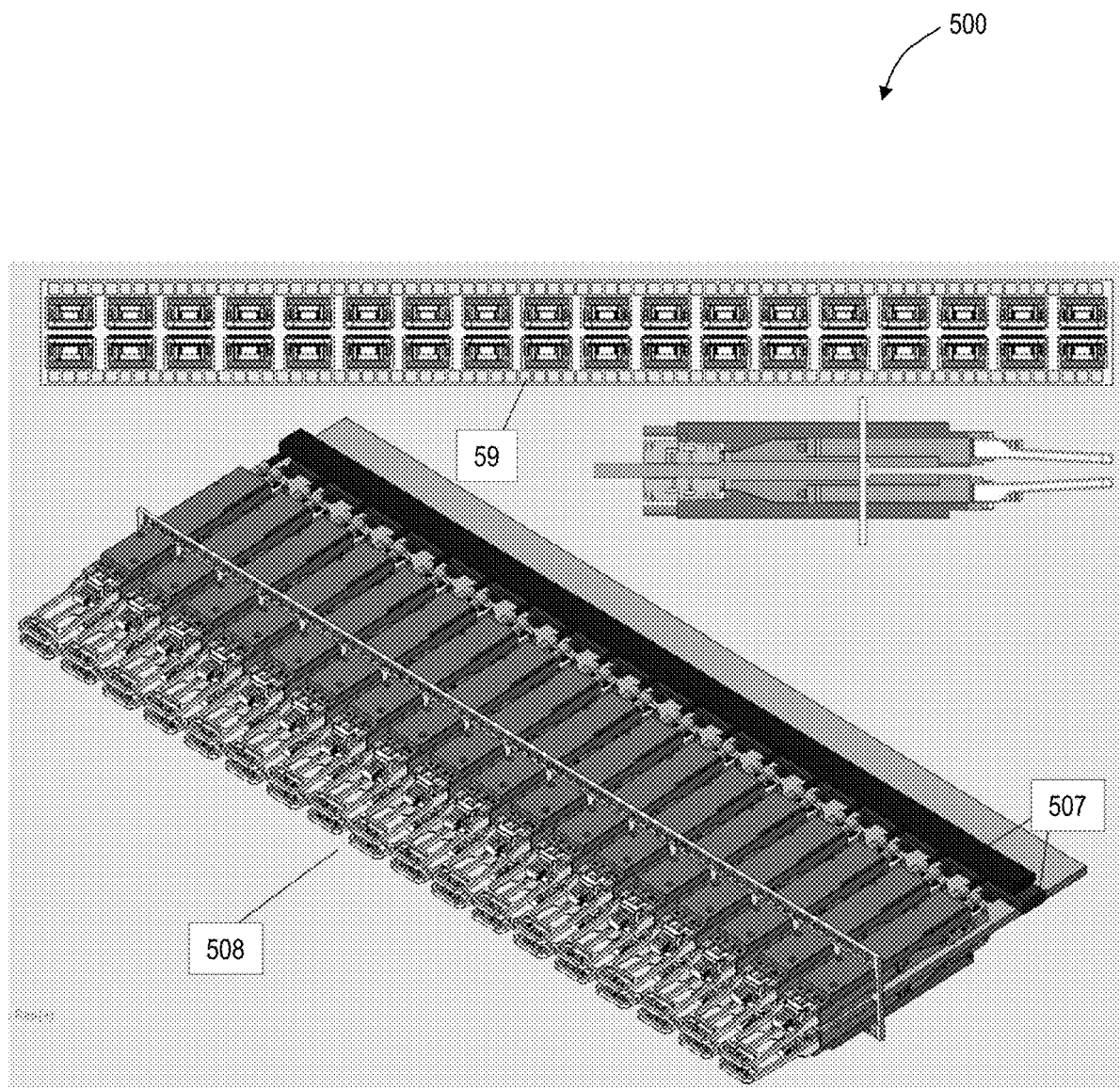
FIGS. 31-34 are perspective diagrams of an embodiment of a system supporting 36 or 54 pluggable optics module, such as QSFP-DD modules.
Figure 32:
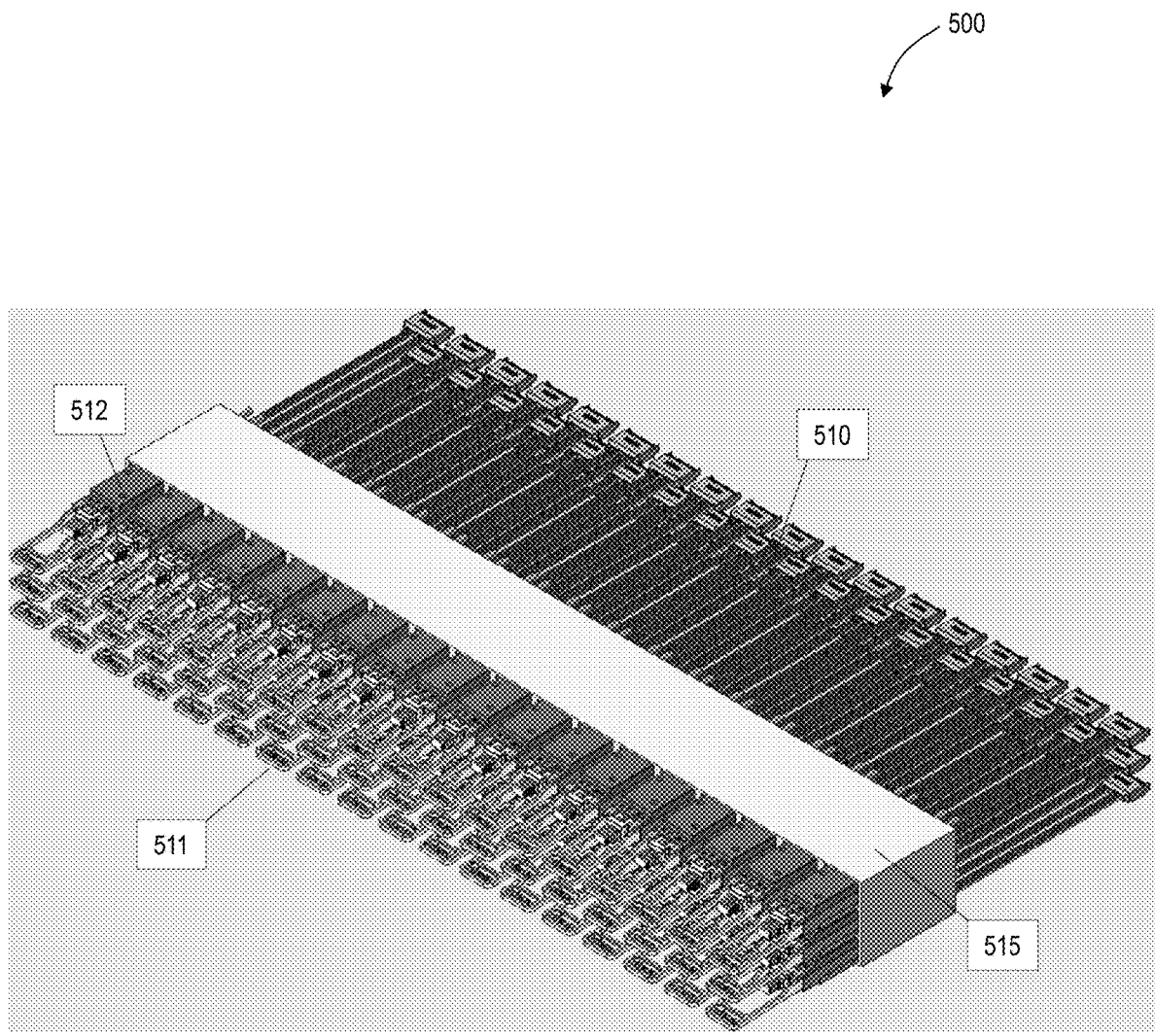
Figure 33:
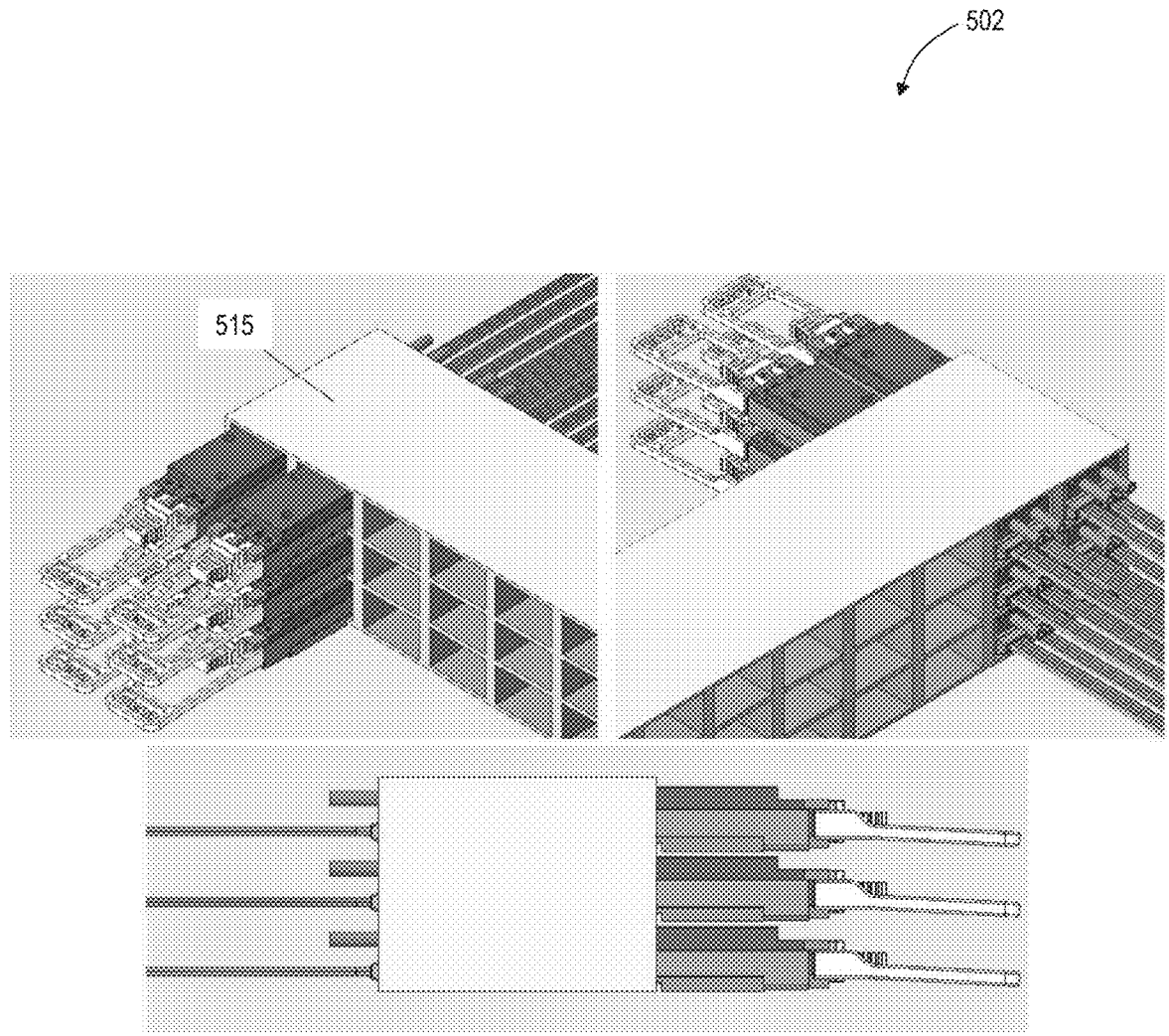
Figure 34:
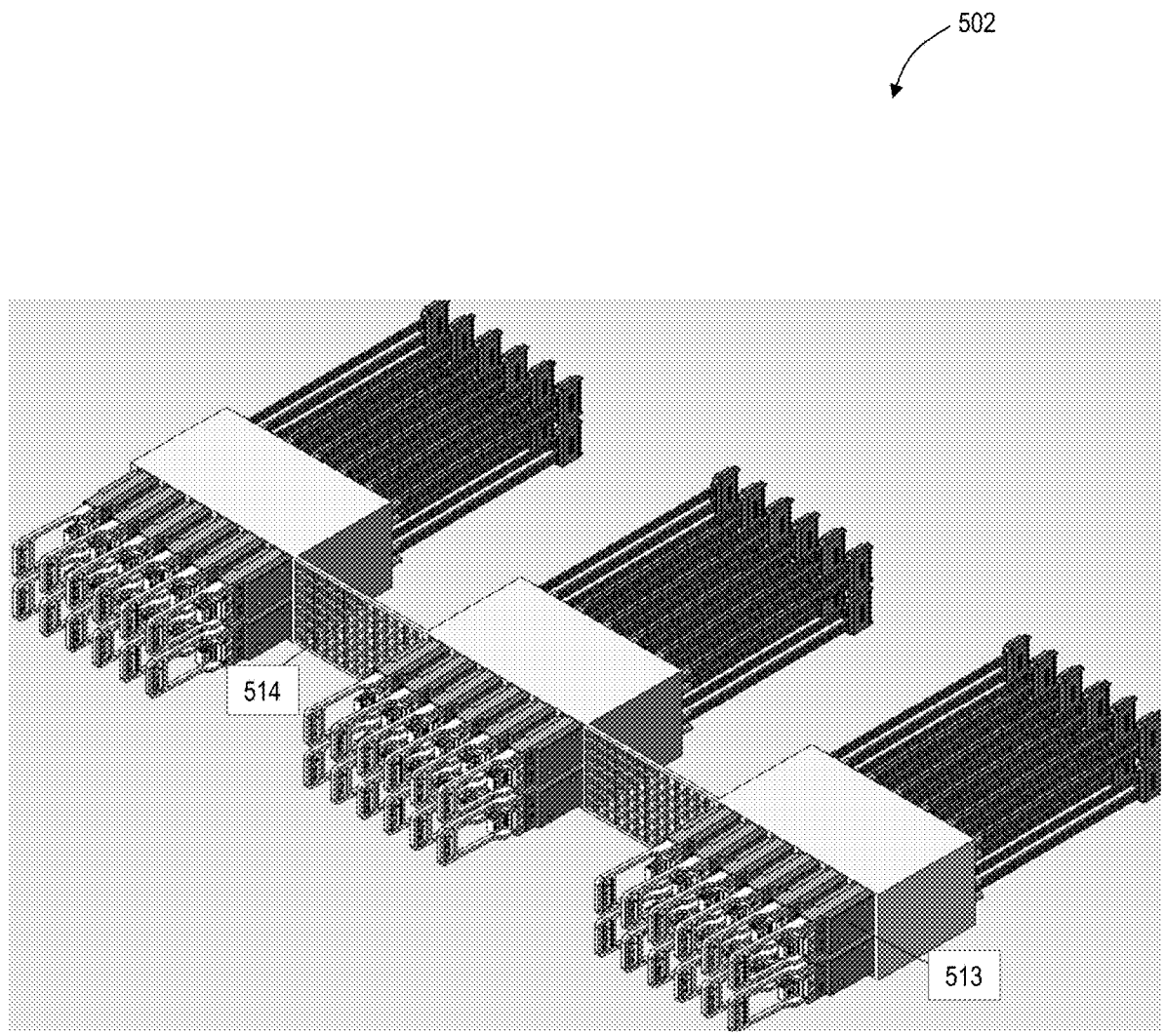

FIGS. 29 and 30 are perspective diagrams of an embodiment of a sled module 400. The sled module 400 includes a body 410, sled card guides 412, one or more sled cards 420, main fluid manifold 460. The main fluid manifold 460 includes a first main manifold fluid connector 455 and a second main manifold fluid connector 456. The first main manifold fluid connector 455 and the second main manifold fluid connector 456 fluidly connect to a sled card 420, such as to sled card fluid connectors, for providing integrated cooling therein. The main manifold fluid connectors and the sled card fluid connectors are configured to provide an inlet and an outlet for the cooling fluid from the manifold 460. These fluid connectors can include blind mate quick disconnects.

As described herein, a sled card 420 is a pluggable module that can plug into the sled module 400, etc. to support some functionality in excess of optical interconnect. For example, the sled module 400 and each sled card 420 can support switching, routing, storage, computing, etc. Also of note, the sled card 420 itself can support pluggable modules. So, the sled card 420 is itself a pluggable module that supports other pluggable modules, e.g., pluggable optics.

The sled cards 420 are configured to receive pluggable optics modules, such as plugs 320. In embodiments, each sled card includes the manifold 360, the first manifold fluid connector 355, the second manifold fluid connector 356, the first manifold flow path 365, the second manifold flow path 366, the electrical connector 390 of FIGS. 22-25, the leak mitigation 380 of FIGS. 26 and 27, and the leak mitigation system 370 of FIG. 28 integrated therein. In some embodiments, the sled cards 420 include the electrical connector 390 with the unitary body, including the integrated manifold fluid connectors, and leak mitigation 380 of FIG. 26. In these embodiments, the first and second manifold flow paths 365 and 366 fluidly connect to the first and second main manifold fluid connectors 455 and 456, respectively.

Example System

FIGS. 31-34 are perspective diagrams of an embodiment of a system 500, 502 supporting 36 or 54 pluggable module 320, such as QSFP-DD sized modules. As described herein, the present disclosure integrates liquid-cooling technology into the pluggable module 10, 320. In various embodiments, the pluggable module 320 can be QSFP's, QSFP-DD's, OSFP's, and CFP2's, but the concept applies equally to electrical-based modules as well as other types of optical modules. The conventional technique for cooling pluggable optical modules is to use a sliding heatsink (air-cooled) on top of a pluggable module. The interface between the pluggable module and the sliding heatsink is a dry contact. The dry interface results in a large thermal resistance that causes a large temperature difference between the pluggable module (heat source) and the heatsink.

With the emergence of 400 GbE technologies, the sliding interface is a major barrier to cooling these high-power plugs. Additionally, air-cooling technologies are no longer sufficient to dissipate the heat generated by these high-power pluggable modules. The present disclosure eliminates the sliding thermal interface between the heat source and the heat sink, and also employs liquid-cooling or two-phase cooling capabilities to remove large amounts of heat from the pluggable optics in a very compact amount of space.

As described herein, this technology is made possible by replacing the top case of the pluggable module 320, for example, a QSFP-DD module, with the integrated coldplate 330. No change is made to the internal component arrangement and circuitry of the pluggable module 320. The liquid fluid path within the module is shown in FIG. 21. The module connection to the main fluid line is made possible by two dripless quick-disconnects, namely the first plug fluid connector 335 and the second plug fluid connector 336.

Liquid lines 507 could be part of a closed-loop cooling system (i.e., pump-reservoir-heat exchanger) or an open-loop cooling system, i.e., facility coolant distribution manifold box. The design is compatible with multiple manufacturing processes. The liquid-cooled top case can be made using metal 3D printing as a one-piece part. It can also be made as a two-piece part, body and lid that utilize cast, forged, metal 3D printed, or machined parts, and the same with the coldplate 230. The lid can then be soldered/brazed to the main body to enclose the fluid flow path. It can also be made by attaching a liquid flow tube 232 into a grooved base as shown in FIG. 10. Attachment could be made by brazing, soldering, or any other thermally conductive methods.

The present approach has many advantages. With the elimination of the sliding thermal interface and taking advantage of the liquid-cooling and/or phase-change capacity for heat removal, this technology will allow for much higher plug powers. The cooling mechanism is integrated within the pluggable module 320, therefore no need for additional heatsinking or cages that accommodate heatsink attachments.

The present approach is compatible with hybrid cooling systems (partially air/liquid cooled) with both side-to-side and front-to-back airflow designs. For side-to-side airflow designs, the air gets hotter from one plug to another resulting in less cooling ability as air travels; in comparison, front-to-end airflow designs takes up space on the faceplate. This solution allows improved performance of side-to-side airflow designs.

36 plugs can be fit in 1Rack Unit 508 with plenty of room available on the faceplate for airflow openings 509 to air-cool the rest of the components inside the system (i.e., front-to-back airflow arrangement).

Using flyover cables 510, 54 plugs can be fit in 1 Rack Unit faceplate 511 in the system 502 with side-to-side airflow arrangement as well as a fully liquid-cooled system.

In a hybrid cooling system (partially air/liquid cooled), using flyover cables, the pluggable modules can be set up in horizontal 512 and/or vertical 513 orientations. This will bring about flexibility in the arrangement of pluggable ports and airflow openings on a faceplate 514 to achieve the most efficient cooling solution on the air-cooled components inside the system. The flyover cables allow signals to go directly to the module resulting in less resistive connections that improve signal loss for high-speed signals, relative to prior art solutions where the electrical connector sits on PCBs.

The liquid-cooled pluggable module 320 does not require additional heatsinking. Therefore, the conventional cages can be eliminated and an extruded aluminum faceplate 515 can be used to accommodate 54 QSFP-sized modules in 1 rack unit. A guidance mechanism will be required for the pluggable modules to keep the electrical and liquid connectors in place. Unlike regular pluggables with heat sinks, there is no cage that sits on the PCB; rather, the pluggables of this disclosure will mate directly to the PCB and not require a cage, and therefore requires a guidance mechanism that help guide the plug to mate to the connector made.

This is the ultimate in cooling performance for a pluggable optical module. Current heatsinking methods are proving increasingly difficult with increases in the plug power. The present disclosure provides the cooling required for future high power pluggable optical modules (400 GbE-800 GbE and beyond). The present disclosure enables extreme faceplate density (port count) with pluggable modules, in particular plugs with high power, high performance, and small form factor such as long-reach coherent optics. Also, there is no need for additional heatsinking. 36 plugs can be fit in 1RU with plenty of room available on the faceplate for airflow openings to air-cool the rest of the components inside the box. Using flyover cables, 54 plugs can be fit in 1RU faceplate in a side-to-side airflow arrangement as well as a fully liquid-cooled system.

Experimental Results

Liquid cooling is desirable because thermal properties of liquids are far superior than those of air (i.e., orders of magnitudes better). Convective heat transfer is a product of "fluid flow properties" and "the space/surface available for cooling." Product design is at the limit of available space preventing additional heatsinks, requiring a new approach. With superior thermal properties of liquids, the space required for cooling can be minimized, which opens the door for more compact architectures.

Two liquid coldplates (i.e., liquid heatsink) were designed and prototyped, aiming to cool CFP2-DCO (400 GbE-32 W) (coldplate in FIG. 14) and QSFP-DD (400 GbE-18 W) (coldplates in FIGS. 7-11). The coldplates were designed with the following objectives i) keep the optics below their temperature ratings at elevated ambient temperatures, ii) small dimensions (e.g., coldplates do not exceed the cage footprint), and iii) capable of cooling the modules with minimal liquid flow/pressure supplied. For example, FIG. 15 includes 36×QSFP and their coldplates in a 1RU shelf. For a CFP2 form factor, the implementation is thin enough to fit two CFP2s belly-to-belly in 1RU height.

Figure 35:
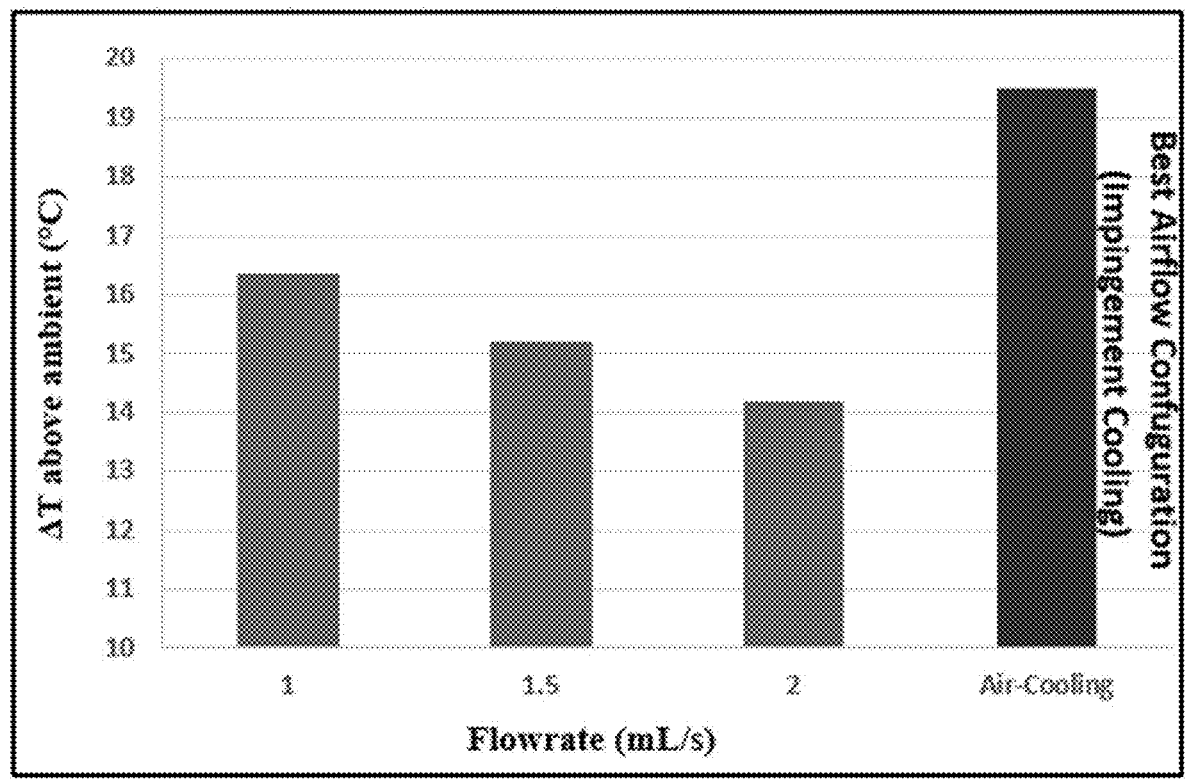
FIG. 35 is a graph illustrating temperature for different flow rates for the liquid cooling using a coldplate and for air cooling with a heat sink.

A test setup was built to investigate the cooling performance of the liquid coldplates when used with working pluggable optics. A CFP2-DCO test board was used as the test platform with an optical loop-back CFP2-DCO dissipating ~23.7 W. An air-cooling benchmark test was conducted for comparison purposes. To create an ideal air-cooling condition, a 120 mm fan was placed on top of the CFP2 heatsink with air directly impacting on the heatsink surface (i.e., far beyond cooling provided in real applications). The CFP2-DCO air-cooling test resulted in a CFP2 temperature 19.5° C. above ambient (i.e., $\Delta T=19.5°$ C.). The CFP2 heatsink was removed and replaced by the 3 mm thick coldplate. The liquid used for testing was a commercial propylene glycol solution widely used for electronics cooling. Three different flowrates were tested 1 mL/s, 1.5 mL/s, and 2 mL/s (i.e., liquid speed: 0.12 m/s to 0.24 m/s) and the module temperatures were recorded (see FIG. 35, which is a graph illustrating temperature for different flowrates for the liquid cooling using a coldplate and for air cooling with a heat sink). Taking the lowest flowrate tested (i.e., 1 mL/s-0.12 m/s), the 3 mm-thick liquid coldplate still outperforms the ideal air-cooling condition with a 10 mm heatsink attached to a 120 mm fan.

Common Riding Liquid Coldplate

Figure 36:
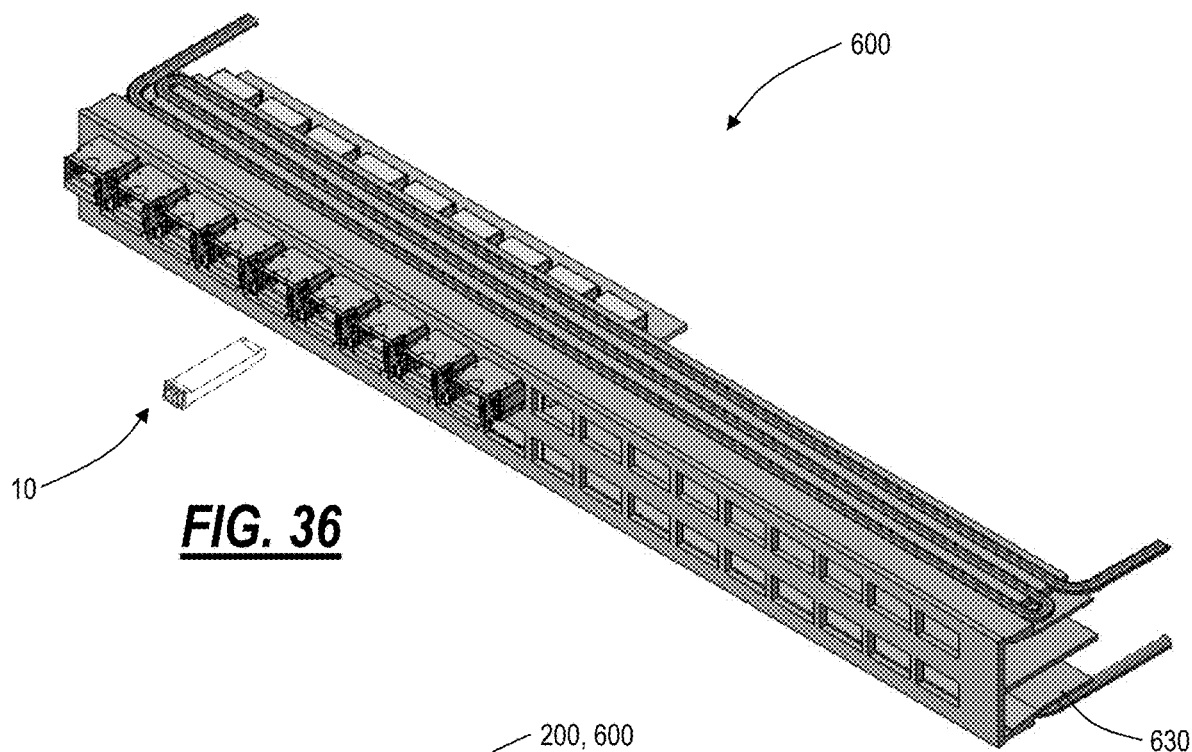
FIGS. 36 and 37 are various diagrams of a module that supports multiple pluggable modules with a common coldplate.
Figure 37:
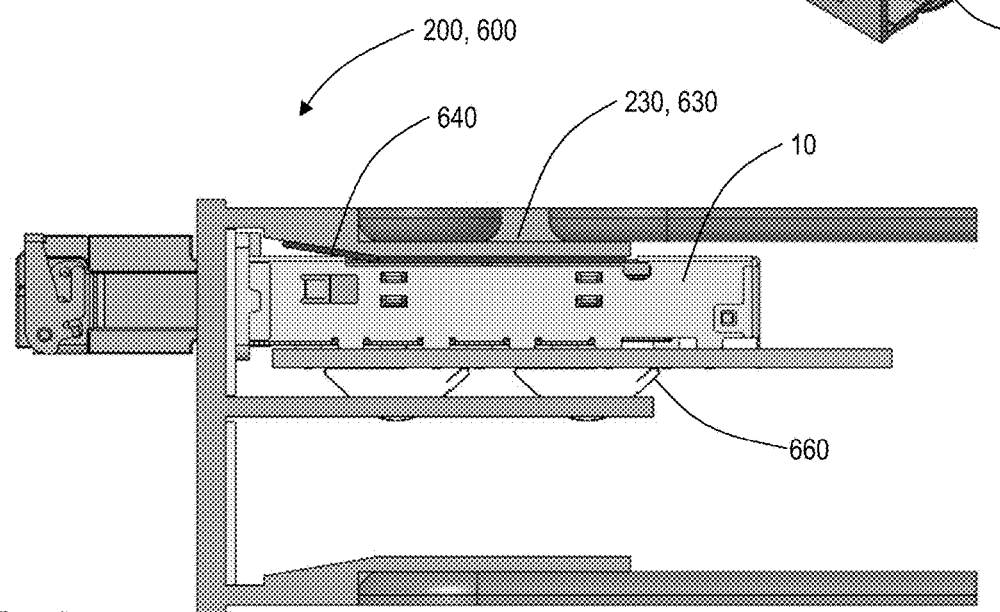

FIGS. 36 and 37 are various diagrams of a module 600 that supports multiple pluggable modules 10 with a common coldplate 630. FIG. 36 is a perspective diagram of the module 600, and FIG. 37 is a side perspective diagram of the module 600 of FIG. 36. The riding liquid coldplate described herein includes the coldplate 230 per pluggable module 10. In another embodiment utilizing the same concepts described herein, it is possible to have the common coldplate 630 shared across multiple pluggable modules 10. The common coldplate 630 operates in the same manner as the coldplate 230 and the integrated coldplate 330, except having a larger surface area. Here, in the example of FIG. 36, there are 18 pluggable modules 10 in a row and 36 totals because there are two rows, and two common coldplates 630. The advantages of the common coldplate 630 are reduced liquid connectors relative to the coldplate 230. However, the common coldplate 630 does not cool as well as the coldplate 330 as the dry interface between the plug and the coldplate exists in this solution.

FIG. 37 illustrates thermal contact between a single pluggable module 10 and the riding coldplate 230 or the common coldplate 630. Again, both of the coldplates 230, 630 are riding in the sense the pluggable module 10 is removable. Here, there is a thermal contact 640 which can be the coating on the coldplate 230, 630. It is diagonally tilted upward at the entry so as to prevent snagging when the pluggable module 10 is inserted. Once inserted, the pluggable module 10's housing on the top makes contact with the thermal contact 640, and the cage can include a spring-type gasket 660 to bias the pluggable module 10 to the thermal contact 640. The bias force can be tuned.

Advantages

The present disclosure provides significant temperature reduction of Integrated Tunable Laser Assemblies (ITLA) including nano-ITLA (nITLA) including at the nose of the plug especially in side-to-side airflow configuration. The integrated liquid cooled plug brings the cooling out to the nITLA even if it sits beyond the faceplate. This would reduce the touch temperature of the case above the nITLA.

This approach allows delivery of more power to the plug: Temperature rise at the electrical connector (i.e., power contact point) is a limiting factor for delivering power to recent/future high-rate plugs (400 G-800 G). Liquid-cooling could help to keep the power contacts cool and increase the power capacity.

For an integrated coldplate 330, the liquid and electrical connections can be integrated in a common body. The plug would connect to both electrical and liquid line at the same time. Liquid quick-disconnects would work as alignment pins. This would help control tolerancing issues between the liquid and electrical connections.

Also, the present disclosure provides extraction force improvement: One existing problem is that dry-contact, which is associated with some extraction force. Although a low extraction force is desired (specified as a limit in the MSA), it is a choke-point in the thermal design: thermally, it is desirable to have high contact pressure, but this is not possible because it is directly correlated with high extraction force. The integrated liquid cooled pluggable allows elimination of the portion of the extraction force associated with heat sink contact pressure (while of course adding the quick connect force). The new quick connect force is—in its optimization—a force less-than-or-equal-to the eliminated heat-sink-contact force. The quick connect force is fixed and consistent and predictable among various solutions. It does not scale with pressure or plug surface area or surface quality or finish type.

Upgradeable Hybrid Air/Liquid Cooling of Eletcro-Optical Systems with Quick Disconnects The present disclosure pertains to an electro-optical communications platform normally cooled with high velocity air. An alternate liquid cooling solution that is described here includes conceived and designed as a drop-in replacement for all or part of a conduction and convection-based cooling system.

Figures 38, 39:
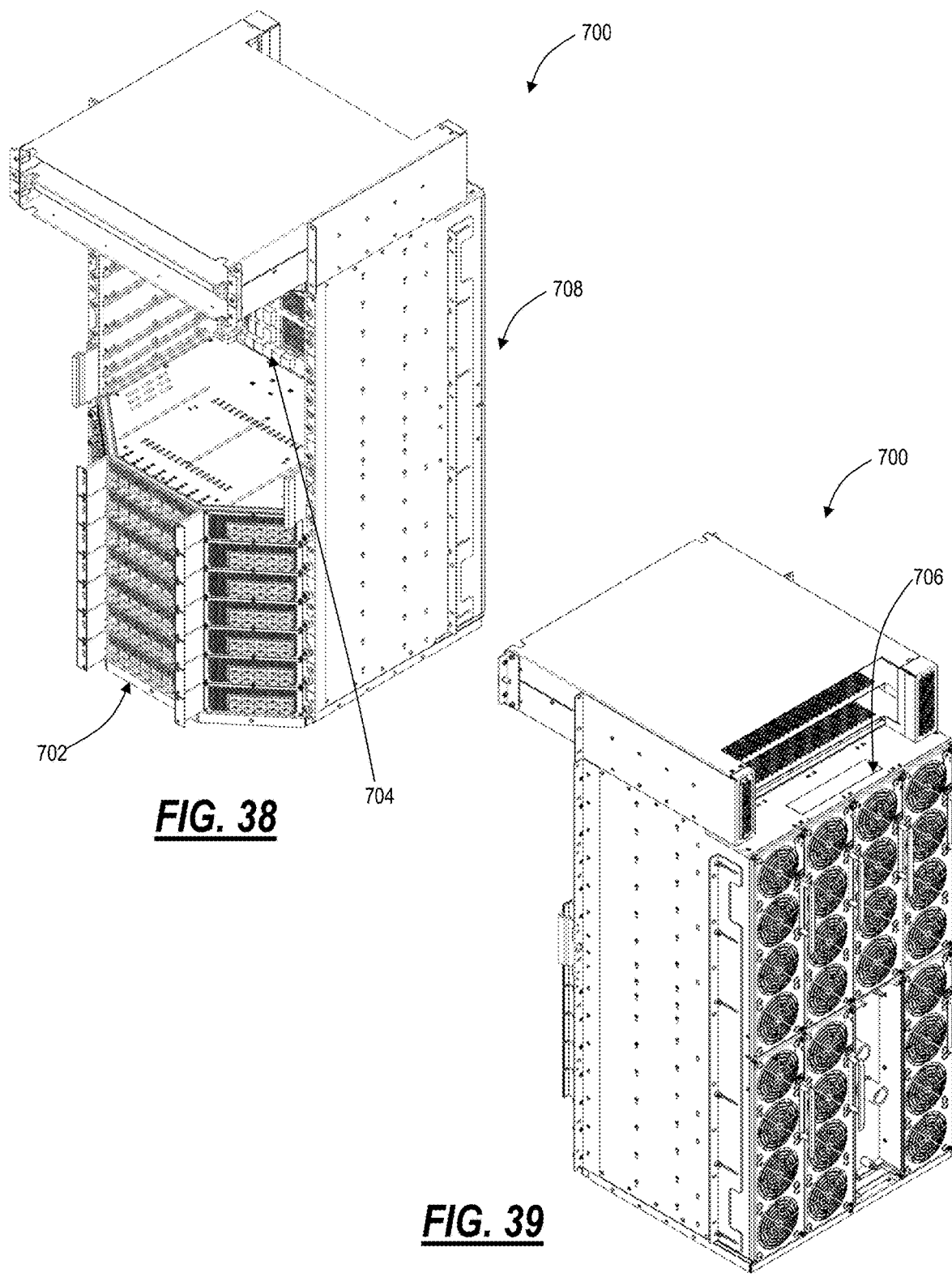
FIGS. 38-39 are various perspective diagrams of another network element platform.

FIGS. 38-39 are various perspective diagrams of another network element 700 platform. FIG. 38 is a front perspective diagram of the network element 700 platform, and FIG. 39 is a rear perspective diagram of the network element 700 platform. The network element 700 is a shelf based electro-optical transmission system that includes slot-based circuit packs 702 on its front side that plug into a backplane 704 for control via connectors to a set of control modules. The network element 700 contains fan units 706 on its rear which plug into the rear of the same backplane and receive control signals from the same control modules.

The circuit packs 702 (also known as modules, line modules, line cards, cards, plugs, blades, etc.) plug into a slot in a shelf 708 and connect to the backplane 704 to receive power and control signals. In an air-based cooling solution, each optical or electrical component with a high-power dissipation density is cooled with finned heatsinks, heat pipes, and/or vapor chamber assemblies. Devices in such systems are becoming denser and producing more heat. We are at the limits of being able to cool highly heat dissipative devices with the fans 706. On the near horizon, we have high power devices (over 1000 W) and plugs (over 30-35 W) that are beyond the capability of forced cooled convection in the space available. This will necessitate liquid cooling.

The fans 706 have evolved to cool greater loads with revolutions per minute (RPM), noise, and power increasing to unreasonable levels. We are currently beyond the point where high-power air-cooled devices can exist in a user-friendly environment free of ear protection.

Replacing all or part of the air-cooled system with liquid cooled components allows the cooling of hotter devices and reduction in fan speed to reduce the system noise to a workable level.

Figure 41:
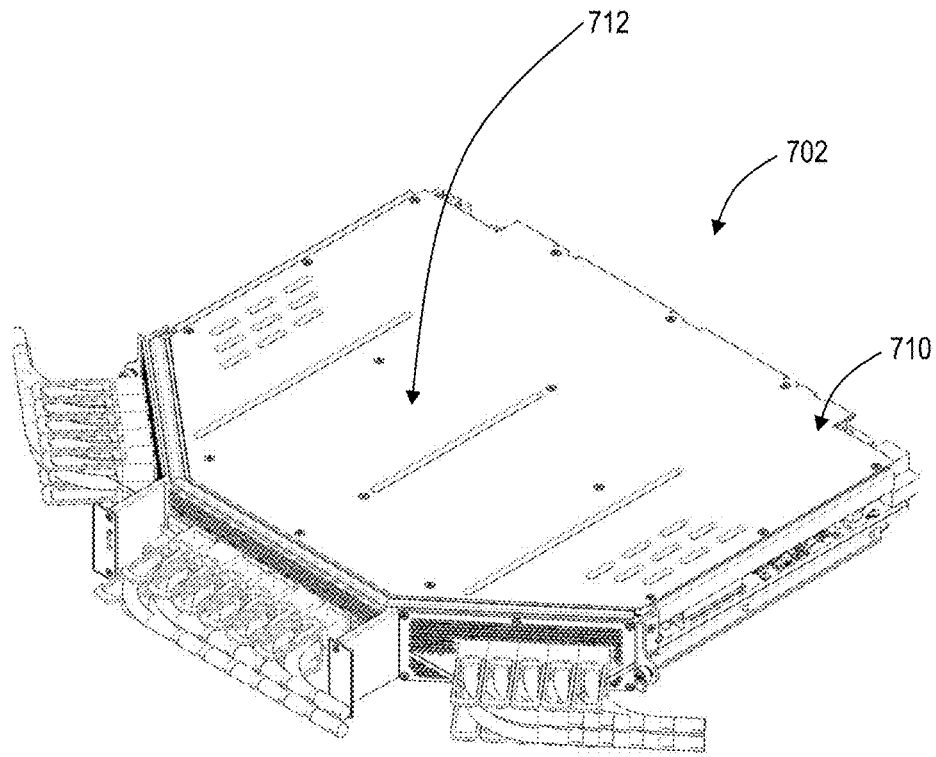
FIGS. 40-41 are perspective diagrams of a circuit pack without a vapor chamber (FIG. 40) to show QSFP-DD heatsinks and with the vapor chamber (FIG. 41).
Figure 40:
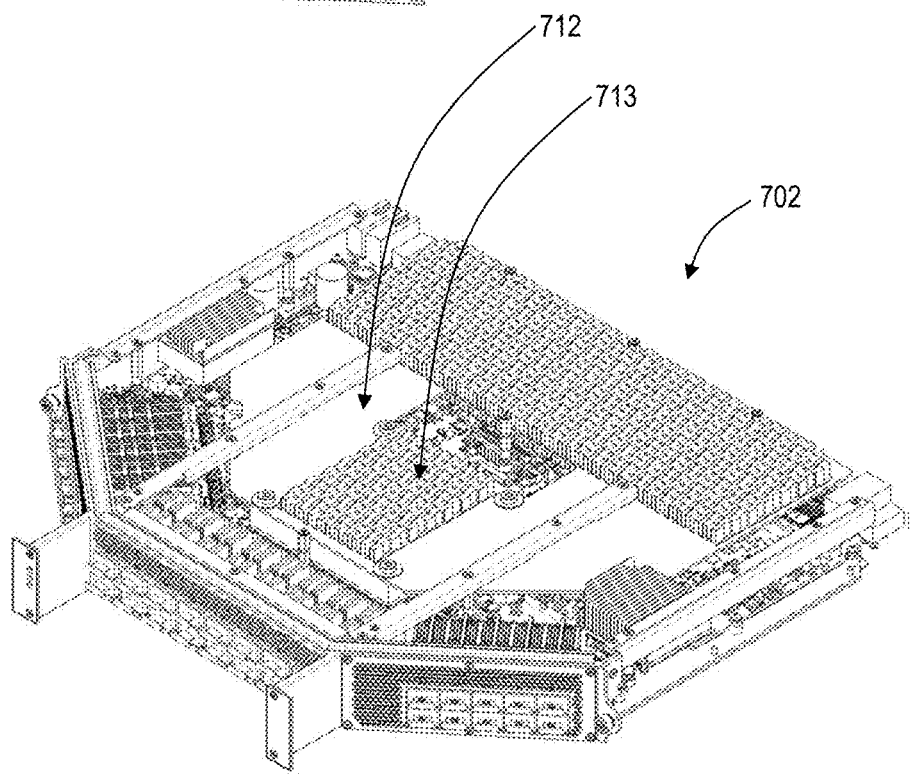

FIGS. 40-41 are perspective diagrams of a circuit pack 702 without a vapor chamber 712 (FIG. 40) to show QSFP-DD heatsinks 713 and with the vapor chamber 712 (FIG. 41). A cover 710 protects the components below from damage during insertion/extraction.

Figure 43:
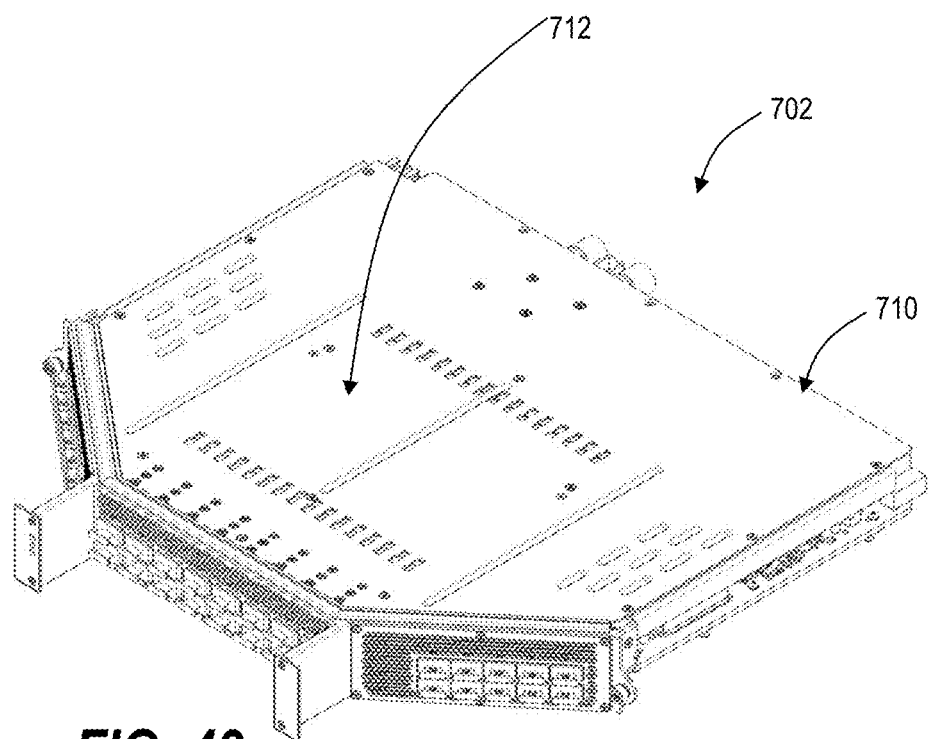
FIGS. 42-43 are perspective diagrams of the circuit pack without a vapor chamber (FIG. 42) to show liquid cooling cold blocks to replace the QSFP-DD heatsinks and with the vapor chamber (FIG. 43).
Figure 42:
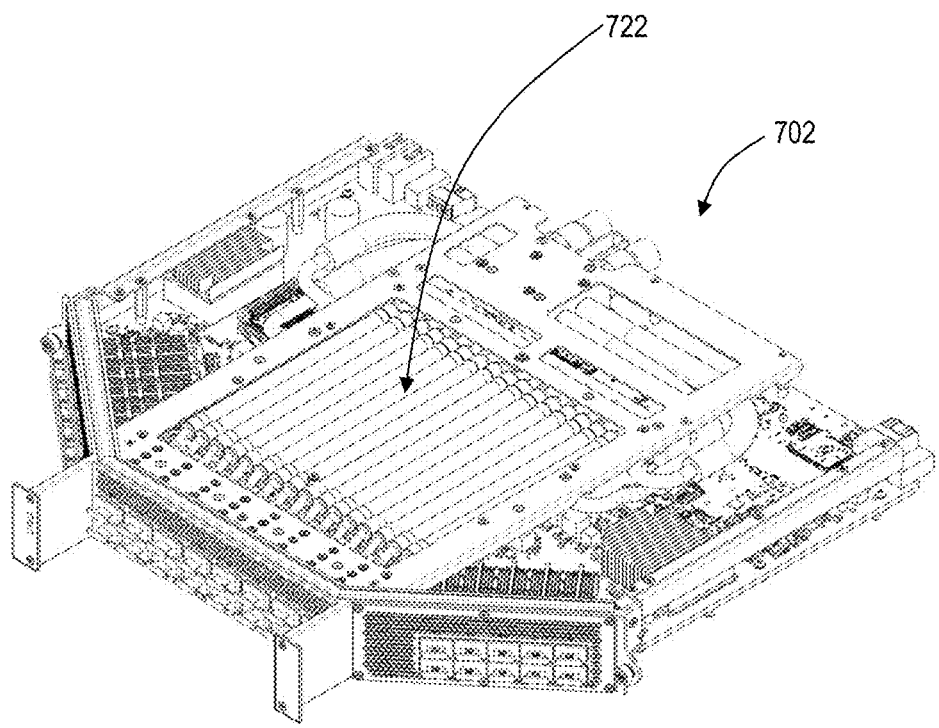

FIGS. 42-43 are perspective diagrams of the circuit pack 702 without a vapor chamber 712 (FIG. 42) to show liquid cooling tubes of a liquid cooling harness 722 for liquid distribution going to cold blocks (not shown) to replace the QSFP-DD heatsinks 713 and with the vapor chamber 712 (FIG. 43).

Figure 44:
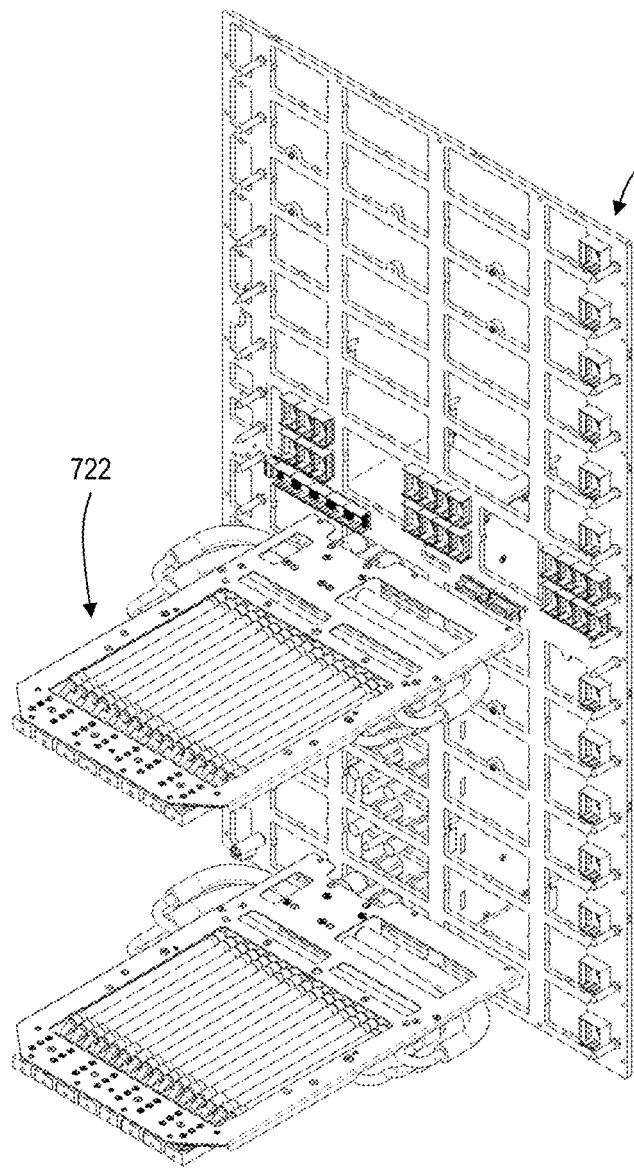
FIG. 44 is a diagram of the backplane and the liquid cooling cold blocks without other components in the shelf.
Figure 45:
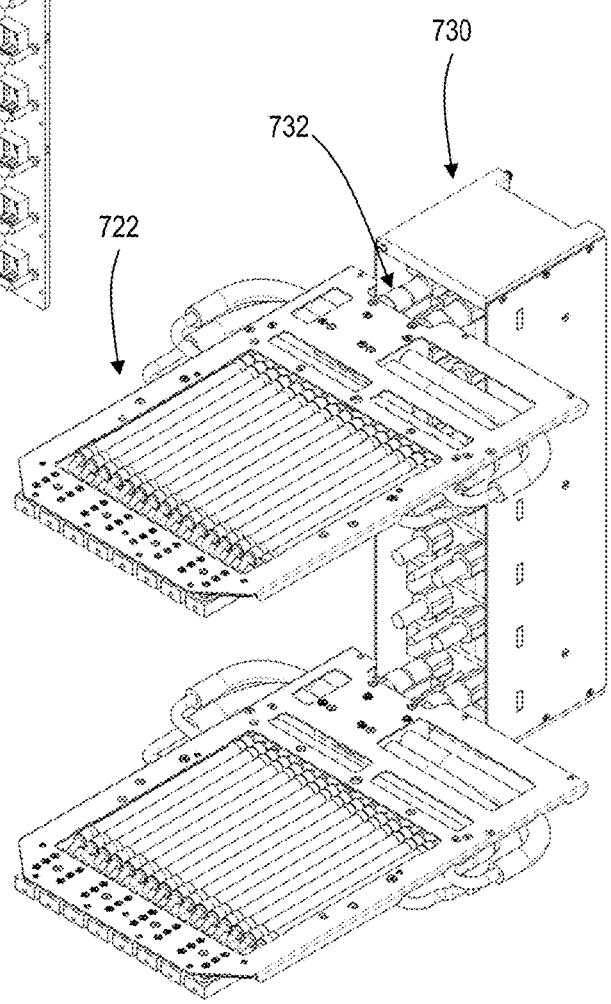
FIG. 45 is a front perspective diagram and FIG. 46 is a rear perspective diagram of a coolant distribution manifold box connected to the liquid cooling cold blocks with the backplane removed for illustration purposes.
Figure 46:
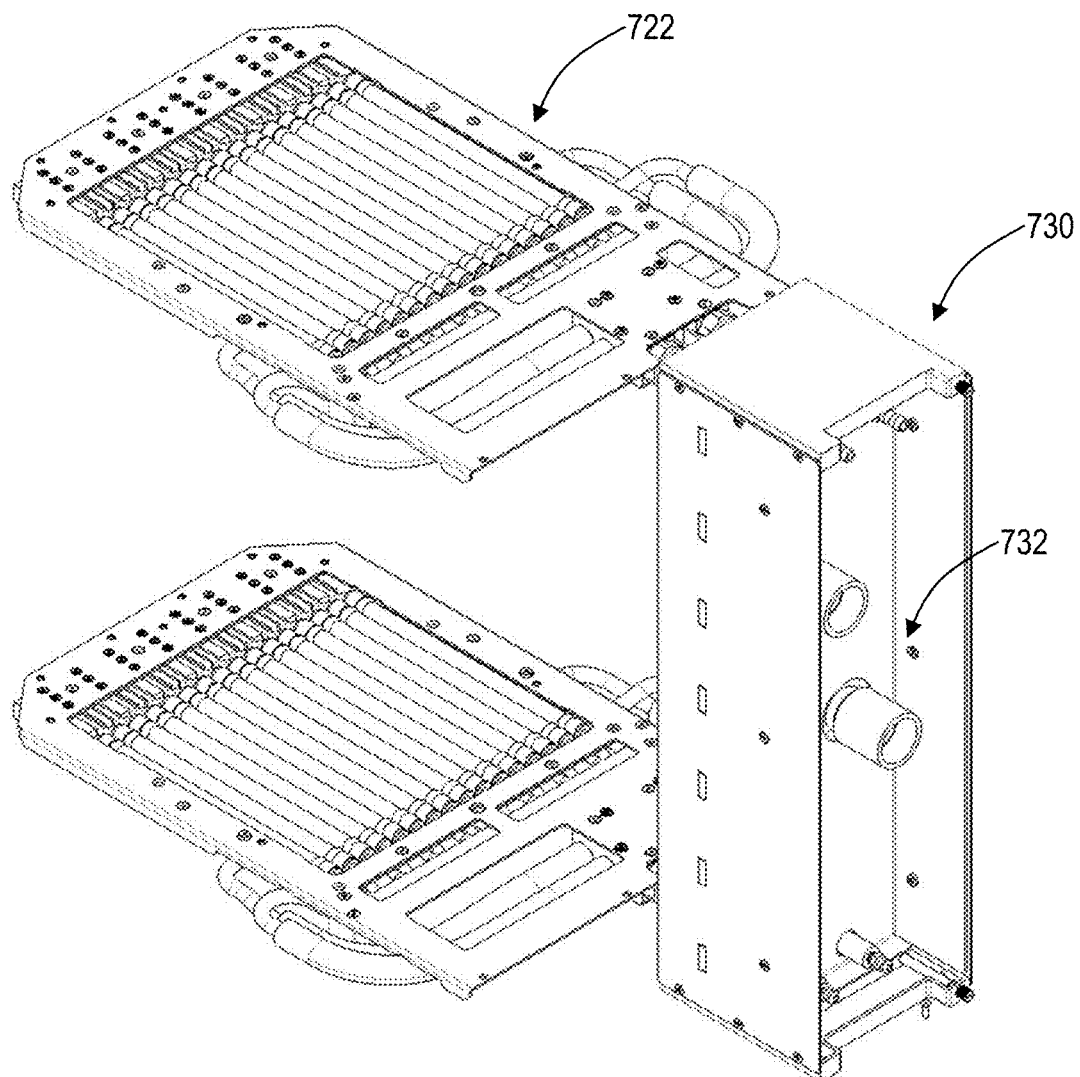

FIG. 44 is a diagram of the backplane 706 and the liquid cooling harness 722 without other components in the shelf 708. FIG. 45 is a front perspective diagram and FIG. 46 is a rear perspective diagram of a coolant distribution manifold box 730 connected to the liquid cooling support harness that can drop onto the circuit pack 702 with the backplane 706 removed for illustration purposes. The coolant distribution manifold box 730 has height and width dimensions substantially the same as the replaced fan unit 706 (FIG. 39).

Liquid cooling of devices in the circuit pack 702 is achievable by implementing a system containing a coolant distribution manifold box 730 or cooling line adjacent to the shelf 708, a connection of hoses from the harness mounted manifolds to a rear of a shelf mounted vertical inlet and return manifolds containing quick disconnect connections, and various manifolds and tubes to cold plates on the circuit pack 702 to be cooled that mate to the quick disconnects on the vertical manifold 732.

Connecting a circuit pack 702 in a slot to a rear mounted manifold is made possible by making a series of holes in the backplane 706 (see FIG. 44 with the shelf 708 hidden) which can be used for air flow or passing of quick disconnect fittings from a circuit pack 702 to a rear manifold 732. Quick disconnects on the liquid cooled circuit can simultaneously or concurrently connect with electrical connectors on the backplane 706.

Although the network element 700 shown shows horizontal circuit packs 702 on the front and a vertical manifold 732 on the rear, this configuration could reverse such that there are vertical circuit packs on the front and horizontal manifolds on the rear. The coolant distribution manifold box 730 includes various input and output ports on the vertical manifold 732 to connect to multiple liquid cooling harnesses 722 and single input/output ports 734 on the rear of the coolant distribution manifold box 730.

In an embodiment, a liquid cooling section can be provisioned by removing one of the rear airflow cooling modules and replacing it with a liquid cooling distribution/harness module. Since the cooling requirements drastically drop by liquid cooling the hottest components the need for all the previous cooling unit modules is changed. Air distribution to all un-liquid cooled components can still be considered, but a large portion of the air-cooling system can be removed or turned down in speed, to reduce noise and power consumption.

The rear vertical manifold 732 can be attached to the rear of the backplane 706 or could be a removable unit within the size of the removed air-cooling module.

Figure 47:
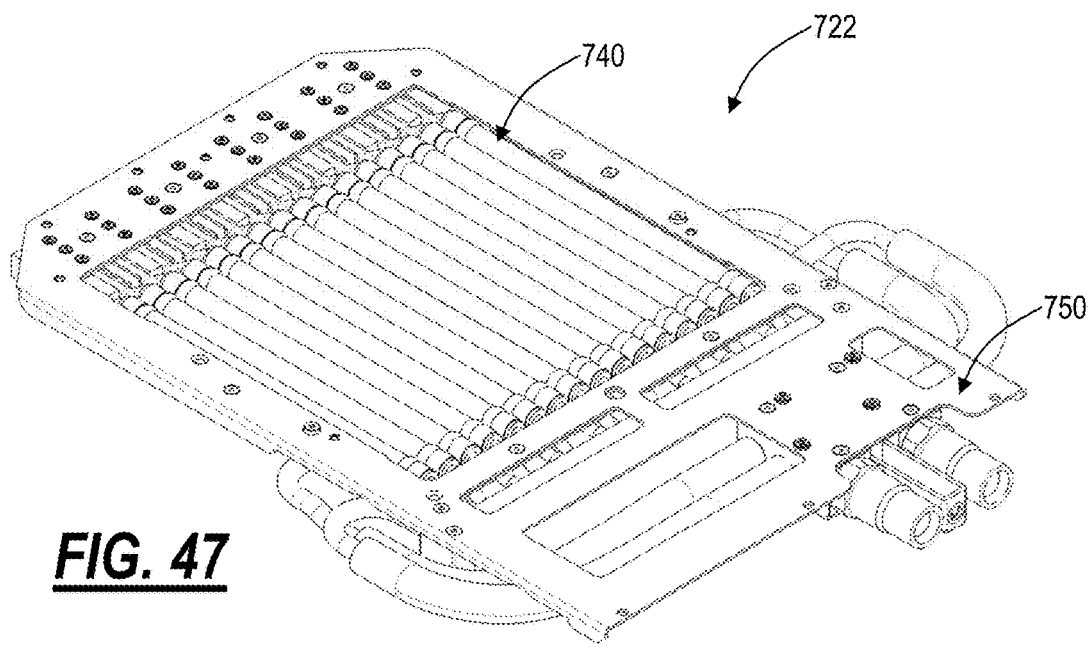
FIGS. 47-50 are various perspective diagrams of a liquid cooling cold block.
Figure 48:
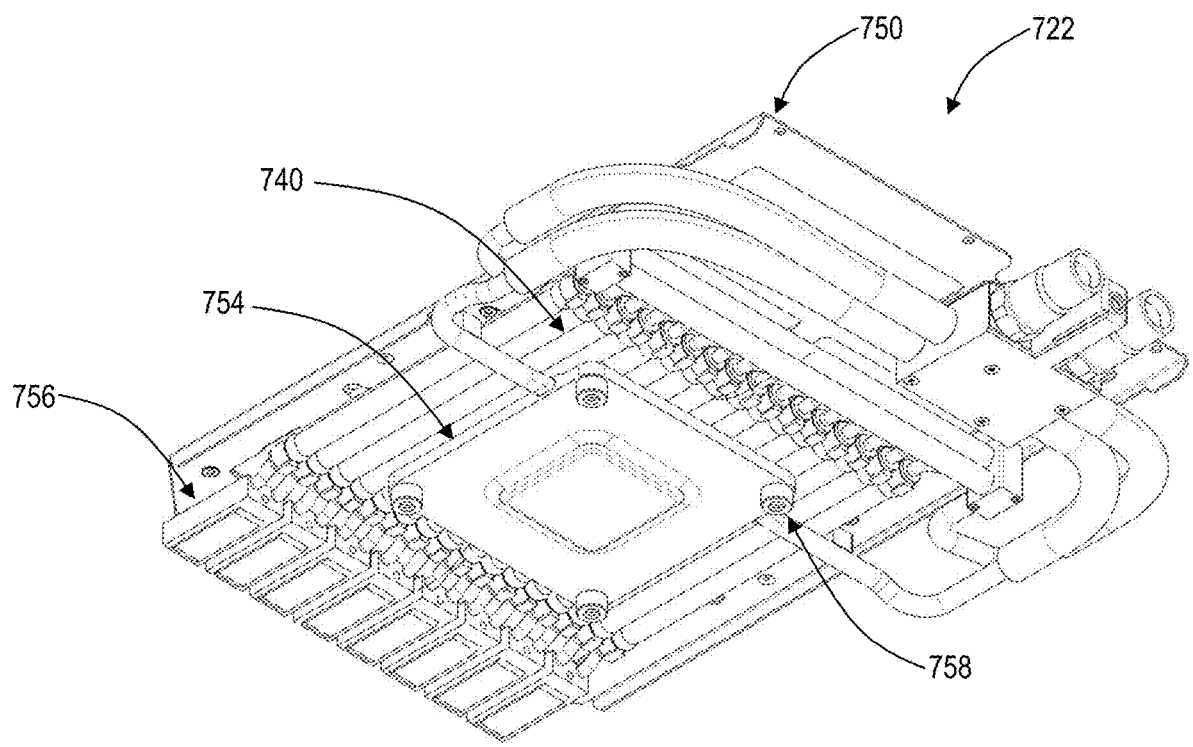
Figure 49:
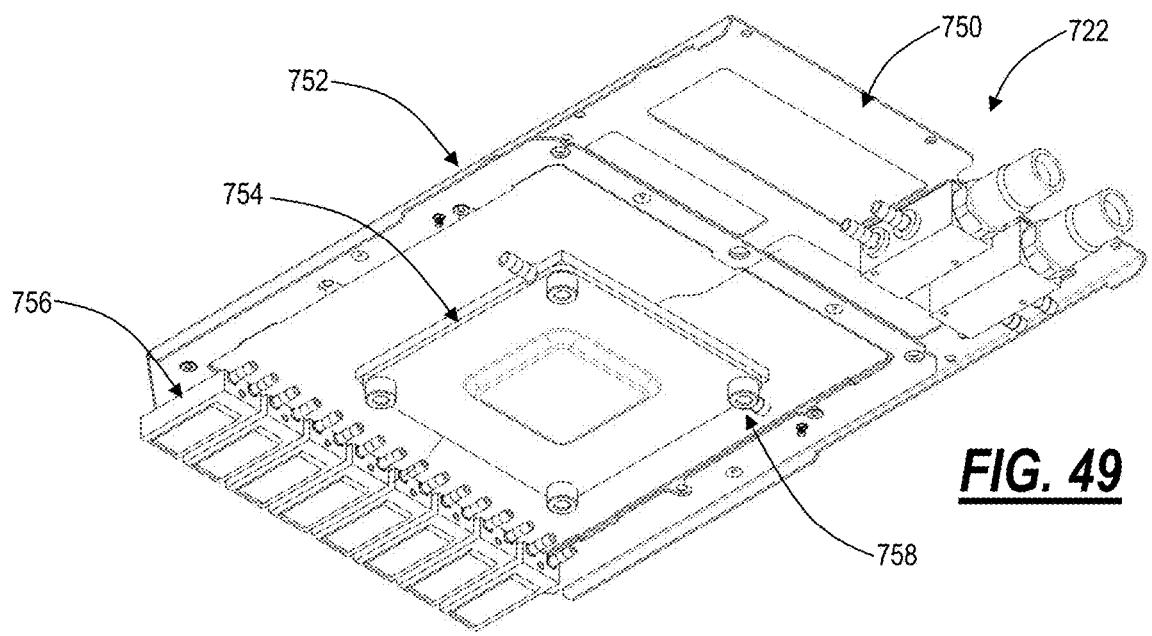
Figure 50:
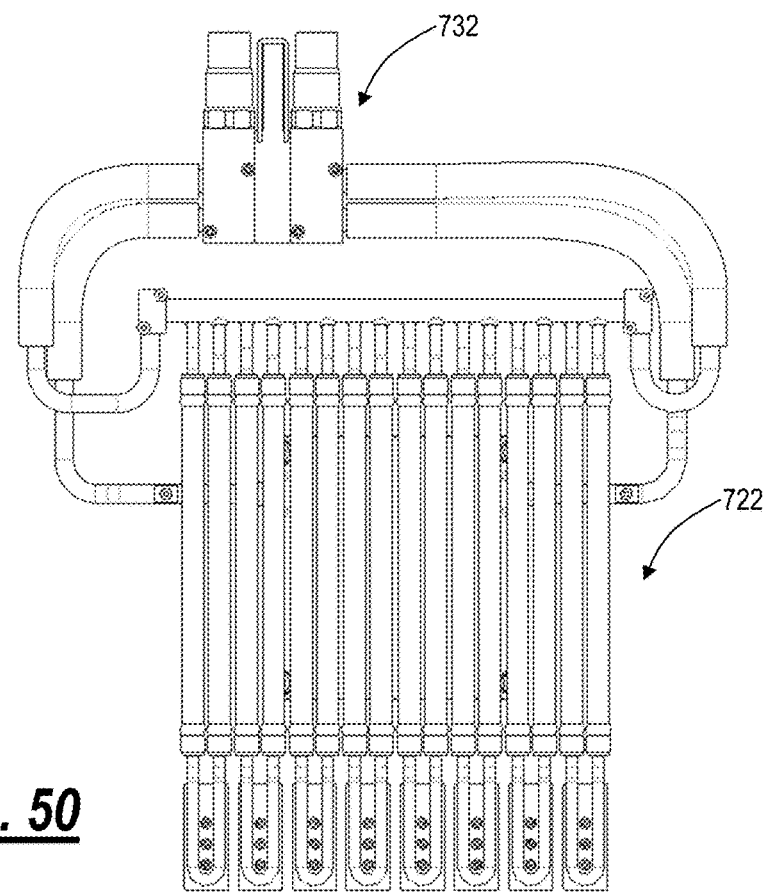

FIGS. 47-50 are various perspective diagrams of a liquid cooling harness 722. FIG. 47 is a top perspective diagram of the liquid cooling harness 722. FIG. 48 is a bottom perspective diagram of the liquid cooling harness 722. FIG. 49 is a bottom perspective diagram of the liquid cooling harness 722 with cooling lines 740 removed. FIG. 50 is a top diagram of the liquid cooling harness 722 with cooling lines 740 connected to the rear manifold 732.

Furthermore, the ability to upgrade an existing electro-optical circuit pack 702 from air cooled to hybrid liquid and air cooled is achievable with a single drop-in liquid cooled harness 750. All items on the harness attach floatingly to a support plate 752 that suspends cold plates 754 and 756 below it. All cold plates 754 and 756 can be pre-assembled and connected fluidly to a series of tubes and manifolds in the cooling lines 740 for equal fluid flow distribution. The attached cold plates 754 can be suspended with shoulder type screws that allow the components play in a vertical position with respect to the circuit board they are attached to. Once in place the cold plates 754 can make contact with hot devices on the main circuit board by various means.

Front mounted cold plates 756 can be preloaded with springs, or leaf springs can be added during assembly, to push down into QSFP-DD cage openings. Once a QSFP-DD pluggable device is plugged in a dry-contact is maintained with the force from the pre-attached or subsequently-attached springs. Also, a cold plate 754 for an ASIC is shown with 4 corner mount screws 758. The mount screws 758 can be shoulder screw type, with a large flat head pushing down on a spring in each corner. The other end of the spring pushes the cold plate toward the ASIC to apply a good force to this fixed ASIC. A thermal interface pad can be used on fixed type devices.

The fluid paths and devices shown on the liquid cooling harness 722 are just an example. The system can be extended in any direction to encompass more items on the circuit board.

Furthermore, a second harness could be attached to the opposite side of the main circuit card to cool items on the opposite side of the board. A manual disconnect could be used to join a top based harness to a bottom based harness. Alternatively, the harness 722 can be configured to loop down to the secondary side with coolant lines for secondary cooling.

FIGS. 51-52 are a front perspective view (FIG. 51) and a rear perspective view of the coolant distribution manifold box 730. Each horizontal position requires an inlet quick disconnect and an outlet quick disconnect, and hence there is one vertical inlet manifold and one vertical outlet manifold. The unit will also have on its rear connections to an inlet hose and outlet hose, shown as large diameter tubes on the rear. It is also advantageous to have an automatic or manual air bleeder valve at the top of the system, so that air does not build up in the system. Bleeder valves at the bottom can be used to bleed or drain fluid from the system. The manifold supply and return may each include a port for an air bleed valve and a port for a drain. The coolant distribution manifold box 730 may also include an array of guidance pins, each of which is used to align a circuit pack module during its insertion to a position that is within an acceptance window of the quick disconnects.

The present disclosure allows removably pluggable liquid cooling of electrical and optical components in a backplane-controlled system, such that quick disconnects pass through the backplane and interconnect simultaneously with electrical and optical connections. It also allows the conversion of an air-cooled system to a liquid cooled system with a drop in liquid cooled harness containing its quick disconnect and encompassing all liquid cooled sections.

The platform can include a mix of liquid-cooled circuit packs and air-cooled circuit packs within one hybrid system. There can also be double blind mating of liquid connections for in-service module replacement: insert a rear liquid cooling unit into existing circuit packs or insert a circuit pack into existing rear liquid cooling units.

The rear module can optionally have one or more of the following within the module: fans, liquid interfaces, active fabric circuits, or coolant distribution manifold box components (e.g., pumps, radiators, etc.). There might or might not be a backplane present.

The airflow path can have 90-degree bends; not limited to front-to-back airflow. There can be redundant scenarios whereby a front card can interface with two or more rear liquid modules.

The vertical manifold may be integrated with the shelf assembly, or it may exist as a module which optionally attaches to the shelf assembly. In the latter option, the manifold module may be added to the shelf assembly as needed, or in a specific implementation, it can replace a fan module.

This system allows air cooled cooling devices like heatsinks, vapor chambers, and loop heat pipes to be replaced on the same circuit card with a drop-in liquid cool harness encompassing manifolds and liquid distribution and containing a quick disconnect connection to a rear mounted vertical manifold distribution system. The drop-in harness is pre-filled, and pressure tested with liquid before swapping it into a circuit pack.

Conclusion

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, processor, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A hybrid air/liquid-cooled network element comprising:
   a backplane defining a plurality of holes;
   one or more printed circuit boards disposed on one side of the backplane;
   a plurality of fan units coupled to an opposite side of the backplane and adapted to circulate an air flow to components disposed on the one or more printed circuit boards through certain of the plurality of holes defined by the backplane; and
   one or more coolant distribution manifold boxes coupled to the opposite side of the backplane adjacent to the plurality of fan units and adapted to circulate a coolant fluid flow to one or more cold plates disposed adjacent to components disposed on the one or more printed circuit boards through other of the plurality of holes defined by the backplane;
   wherein the one or more coolant distribution manifold boxes each have height and width dimensions substantially the same as each of the plurality of fan units.

2. The hybrid air/liquid-cooled network element of claim 1, wherein the plurality of fan units are arranged in rows and columns along the opposite side of the backplane with the air flow delivered orthogonally to the one or more printed circuit boards.

3. The hybrid air/liquid-cooled network element of claim 2, wherein each of the one or more coolant distribution manifold boxes is arranged among the plurality of fan units in one of the rows and columns.

4. The hybrid air/liquid-cooled network element of claim 1, wherein each of the one or more coolant distribution manifold boxes comprises one or more manifolds adapted to couple one or more coolant lines coupled to the network element to quick disconnects coupled to the one or more cold plates.

5. The hybrid air/liquid-cooled network element of claim 1, wherein the one or more printed circuit boards are each disposed in a module.

6. The hybrid air/liquid-cooled network element of claim 5, further comprising a shelf, wherein the backplane is coupled to the shelf and the module associated with each of the one or more printed circuit boards is disposed in the shelf.

7. A coolant distribution manifold box for use in a hybrid air/liquid-cooled network element, the coolant distribution manifold box comprising:
   one or more manifolds adapted to be coupled to one or more coolant lines coupled to the network element; and
   quick disconnects adapted to be coupled to one or more cold plates disposed adjacent to components disposed on one or more printed circuit boards disposed within the network element;
   wherein the coolant distribution manifold box has height and width dimensions substantially the same as a fan unit adapted to be coupled to the network element;
   wherein a plurality of fan units are adapted to be arranged in rows and columns along a backplane of the network element with an air flow delivered to the one or more printed circuit boards; and
   wherein the coolant distribution manifold box is adapted to be coupled to the backplane of the network element and arranged among the plurality of fan units in one of the rows and columns.

8. The coolant distribution manifold box of claim 7, wherein the one or more printed circuit boards are each disposed in a module.

9. The coolant distribution manifold box of claim 8, wherein the module associated with each of the one or more printed circuit boards is disposed in a shelf of the network element.

10. A method for converting an air-cooled network element to a hybrid air/liquid-cooled network element, the method comprising:
    given a backplane defining a plurality of holes, one or more printed circuit boards disposed on one side of the backplane, and a plurality of fan units coupled to an opposite side of the backplane and adapted to circulate an air flow to components disposed on the one or more printed circuit boards through certain of the plurality of holes defined by the backplane, removing one or more of the plurality of fan units from the opposite side of the backplane; and
    coupling one or more coolant distribution manifold boxes to the opposite side of the backplane in one or more spaces associated with the removed one or more of the plurality of fan units and adjacent to the remaining plurality of fan units, wherein the one or more coolant distribution manifold boxes are adapted to circulate a coolant fluid flow to one or more cold plates disposed adjacent to components disposed on the one or more printed circuit boards through the certain of the plurality of holes defined by the backplane;
    wherein the one or more coolant distribution manifold boxes each have height and width dimensions substantially the same as each of the plurality of fan units.

11. The method of claim 10, wherein the plurality of fan units are arranged in rows and columns along the opposite side of the backplane with the air flow delivered orthogonally to the one or more printed circuit boards.

12. The method of claim 11, wherein each of the one or more coolant distribution manifold boxes is arranged among the plurality of fan units in one of the rows and columns after coupling.

13. The method of claim 10, wherein each of the one or more coolant distribution manifold boxes comprises one or more manifolds adapted to couple one or more coolant lines coupled to the network element to quick disconnects coupled to the one or more cold plates.

14. The method of claim 10, wherein the one or more printed circuit boards are each disposed in a module.

15. The method of claim 10, wherein the module associated with each of the one or more printed circuit boards is disposed in a shelf of the network element.

16. The method of claim 10, wherein the one or one or more printed circuit boards comprise a plurality of printed circuit boards and the method further comprises air cooling some of the plurality of printed circuit boards using the plurality of fan units and liquid cooling some of the plurality of printed circuit boards using the one or more coolant distribution manifold boxes.

* * * * *